(12) United States Patent
Hara et al.

(10) Patent No.: US 11,647,588 B2
(45) Date of Patent: May 9, 2023

(54) ELECTRONIC DEVICE

(71) Applicant: HITACHI ASTEMO, LTD., Hitachinaka (JP)

(72) Inventors: Hideyuki Hara, Hitachinaka (JP); Takuro Kanazawa, Hitachinaka (JP); Narutoshi Yamada, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 17/623,650

(22) PCT Filed: Jul. 1, 2020

(86) PCT No.: PCT/JP2020/025756
§ 371 (c)(1),
(2) Date: Dec. 29, 2021

(87) PCT Pub. No.: WO2021/002374
PCT Pub. Date: Jan. 7, 2021

(65) Prior Publication Data
US 2022/0264746 A1    Aug. 18, 2022

(30) Foreign Application Priority Data
Jul. 3, 2019 (JP) .............................. JP2019-124152

(51) Int. Cl.
*H05K 1/14* (2006.01)

(52) U.S. Cl.
CPC ... *H05K 1/148* (2013.01); *H05K 2201/10151* (2013.01)

(58) Field of Classification Search
CPC .................... H05K 1/148; H05K 2201/10151

USPC ......................................................... 361/803
See application file for complete search history.

(56) References Cited

U.S. PATENT DOCUMENTS

| | | | |
|---|---|---|---|
| 8,975,527 B2 | 3/2015 | Takaoka | |
| 2014/0015730 A1* | 1/2014 | Anguera Pros | H01Q 9/0407 343/860 |
| 2019/0027838 A1* | 1/2019 | Paulotto | H01Q 1/243 |

FOREIGN PATENT DOCUMENTS

| | | |
|---|---|---|
| JP | 2001-230504 A | 8/2001 |
| JP | 2005-236205 A | 9/2005 |
| JP | 2005-247220 A | 9/2005 |
| JP | 2005-285887 A | 10/2005 |

(Continued)

OTHER PUBLICATIONS

International Preliminary Report on Patentability dated Jan. 13, 2022 issued in corresponding International Application No. PCT/JP2020/025756, with English translation, 12 pages.

(Continued)

*Primary Examiner* — Andargie M Aychillhum
(74) *Attorney, Agent, or Firm* — Foley & Lardner LLP

(57) ABSTRACT

A circuit substrate (3) is provided with first and second rigid parts (11, 12) having six metal foil layers, and a thin flexible part (13) having two metal foil layers connecting the two rigid parts. A ground wiring (51) which is shaped like a wide strip is formed on the surface metal foil layer, and a plurality of inter-rigid-part wirings (55) are formed on the inner metal foil layer in parallel lines. Outer edges (51a) of the ground wiring (51) are positioned closer to side edges (13a) of the flexible part (13) than to the inter-rigid-part wirings (55). The ground wiring (51) protects the inter-rigid-part wirings (55) from cracks.

9 Claims, 22 Drawing Sheets

(56) References Cited

FOREIGN PATENT DOCUMENTS

| | | |
|---|---|---|
| JP | 2007-088229 A | 4/2007 |
| JP | 2009-218447 A | 9/2009 |
| JP | 2009-289923 A | 12/2009 |
| JP | 2012-060043 A | 3/2012 |
| JP | 2014-060903 A | 4/2014 |
| JP | 2017-107439 A | 6/2017 |
| WO | WO-2011/043318 A1 | 4/2011 |

OTHER PUBLICATIONS

International Search Report dated Oct. 6, 2020 issued in corresponding International Application No. PCT/JP2020/025756, with English translation, 7 pages.

Notice of Reasons for Refusal dated Sep. 13, 2022 issued in corresponding JP Application No. 2019-124152 with English translation, 8 pages.

* cited by examiner

ELECTRONIC DEVICE

TECHNICAL FIELD

The present invention relates to an electronic device using a circuit substrate capable of being bent so as to be incorporated into a housing in a bent state.

BACKGROUND TECHNOLOGY

In a patent document 1, as a circuit substrate incorporated into a motor unit of a power steering apparatus, a multilayer wiring substrate is disclosed which is formed so as to be used in a bent form having a substantially U-shape by connecting a plurality of rigid parts with flexible parts which are thinner than the rigid parts.

However, in the circuit substrate provided with the flexible parts as mentioned above, minute cracks to a base material tend to occur near the boundaries between the flexible parts and the rigid parts, and there is concern about the occurrence of the insulating failure of inside wiring due to the infiltration of moisture through the cracks with time, and the disconnection of wiring due to an increase in the cracks.

PRIOR ART REFERENCE

Patent Document

Patent Document 1: Japanese Patent Application Publication 2014-60903

SUMMARY OF THE INVENTION

The present invention, in one aspect thereof, is provided with a circuit substrate including two component mounting parts and a flexible part having a thickness thinner than and a flexibility higher than those of each of the component mounting parts, and the flexible part has a plurality of inter-component-mounting-part wirings that are power source positive electrode wirings and signal wirings extending between the two component mounting parts and has at least one ground wiring having side edges along the side edges of the flexible part such that the side edges of the ground wiring are positioned closer to the side edges of the flexible part than to the inter-component-mounting-part wirings.

According to the present invention, the occurrence of cracks or the increasing of the cracks in the flexible part is suppressed by the ground wiring positioned on the relatively outer side, and thereby insulating failure or disconnection of the power source positive electrode wirings and the signal wirings pensioned more on the inner side than the ground wiring is suppressed.

MODE FOR IMPLEMENTING THE INVENTION

In the following, one embodiment in which the present invention is applied to, for example, a control device for an electric power steering apparatus of a vehicle will be explained in detail based on the drawings.

Figure 1:
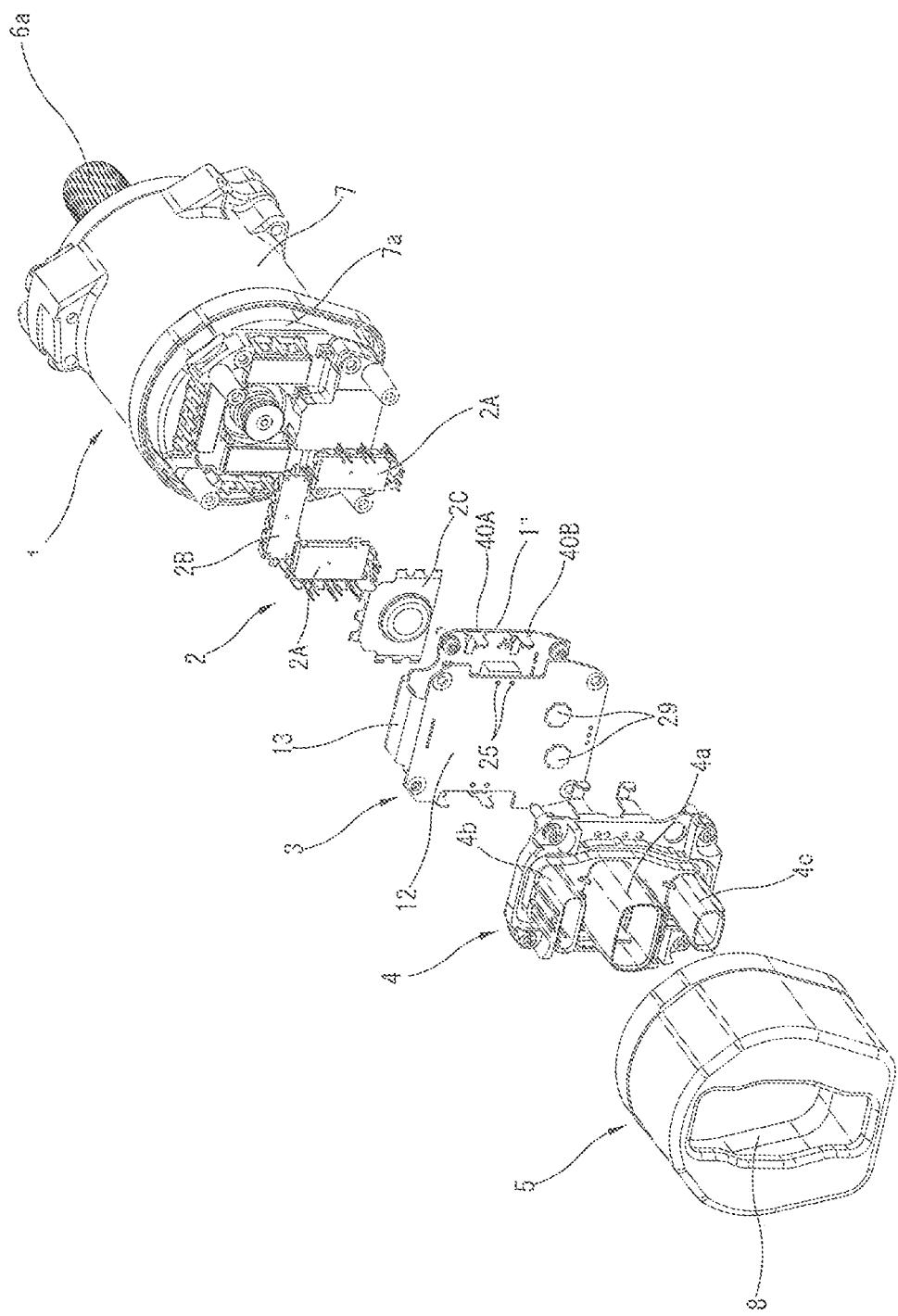
FIG. 1 is a perspective exploded view of an electric actuator device for a power steering apparatus into which a circuit substrate according to the present invention is incorporated.
Figure 2:
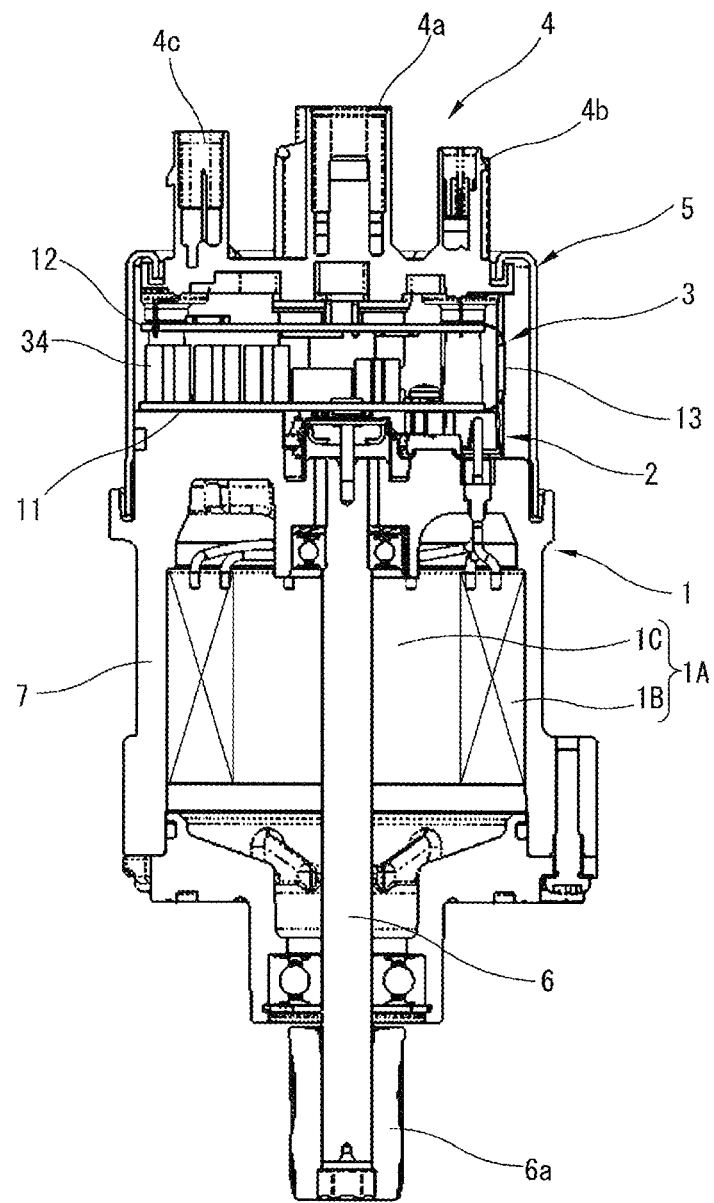
FIG. 2 is a sectional view of the electric actuator device.

FIG. 1 is a perspective exploded view of an electric actuator device for applying steering auxiliary force to a steering mechanism which is not shown in the drawings, in an electric power steering apparatus. In addition, FIG. 2 is a sectional view of the electric actuator device. This electric actuator device is provided with a cylindrical motor part 1, an inverter power module 2, a circuit substrate 3 formed of a multilayer wiring substrate capable of being bent, a connector member 4 in which a plurality of connectors are integrally collected, and a motor cover 5 attached to one end portion of the motor part 1 so as to cover the inverter power module 2, the circuit substrate 3 and the connector member 4.

The motor part 1 is one in which a motor 1A (FIG. 2) corresponding to an electric actuator composed of a stator 1B and a rotor 1C are accommodated in the inside of a cylindrical housing 7. The motor part 1 includes a connecting portion 6a, such as a gear or a spline, at the distal end of a rotation shaft 6 protruding from the distal end surface of the housing 7, so as to be connected to a steering mechanism which is not shown in the drawings via the connecting portion 6a. The motor 1A is a three-phase permanent magnet brushless motor, and the stator 1B is provided with a three-phase coil, and permanent magnets are arranged on the outer peripheral surface of the rotor 1C. Here, in order to give redundancy, the motor 1A is provided with two-system coils and corresponding permanent magnets.

One end portion of the housing 7 that is an opposite side to the connecting portion 6a is formed as a bottom wall portion 7a having a horseshoe-shaped outline such that a part of the outer peripheral edge thereof radially extends, and the motor cover 5 having a horseshoe-shaped outline corresponding to the bottom wall portion 7a is attached so as to cover the bottom wall portion 7a. Then, the inverter power module 2, the circuit substrate 3 and the connector member 4 are accommodated in the space formed between the bottom wall portion 7a and the motor cover 5 so as to be superposed in the axial direction of the rotation shaft 6.

The inverter power module 2 includes two inverter modules 2A for driving the motor 1A, and a relay module 2B that becomes a neutral point relay of the coils, and these are arranged so as to have a substantially U-shape surrounding the rotation shaft 6. Then, these inverter modules 2A and the relay module 2B are fixed to the end surface of the motor part 1 via a pressing member 2C.

The connector member 4 is provided with three connectors directed to the same direction along the axial direction of the rotation shaft 6. Specifically, the connector member 4 is provided with a power source connector 4a positioned in the middle, a sensor input connector 4b to which signals from sensors (for example, a steering angle sensor, a torque sensor, etc.) arranged on the steering mechanism side are input, and a communication connector 4c for carrying out the communication (for example, CAN communication) with other control devices inside a vehicle. These connectors 4a, 4b 4c protrude to the outside through an opening portion 8 of the motor cover 5.

In the electric actuator device of this embodiment, the control device (electronic device) including the inverter power module 2 and the circuit substrate 3 is integrated with the motor part 1, and thereby the size of the whole device can be reduced.

Figure 3:
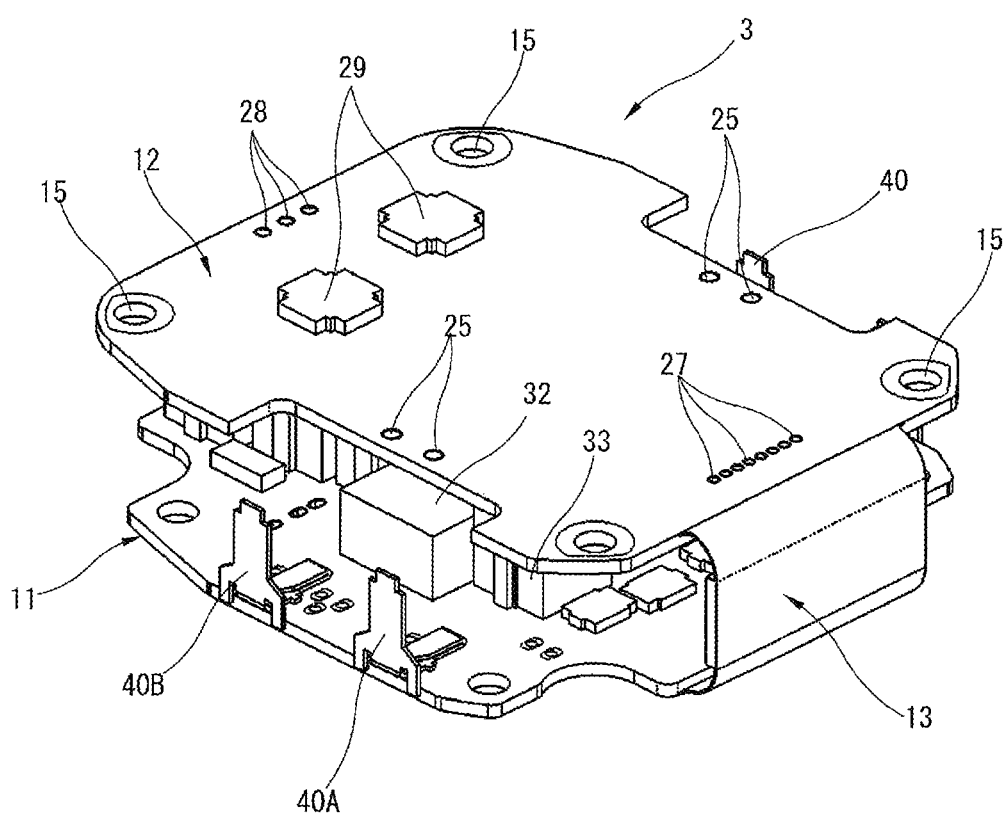
FIG. 3 is a perspective view of the circuit substrate in a state of being bent.
Figure 4:
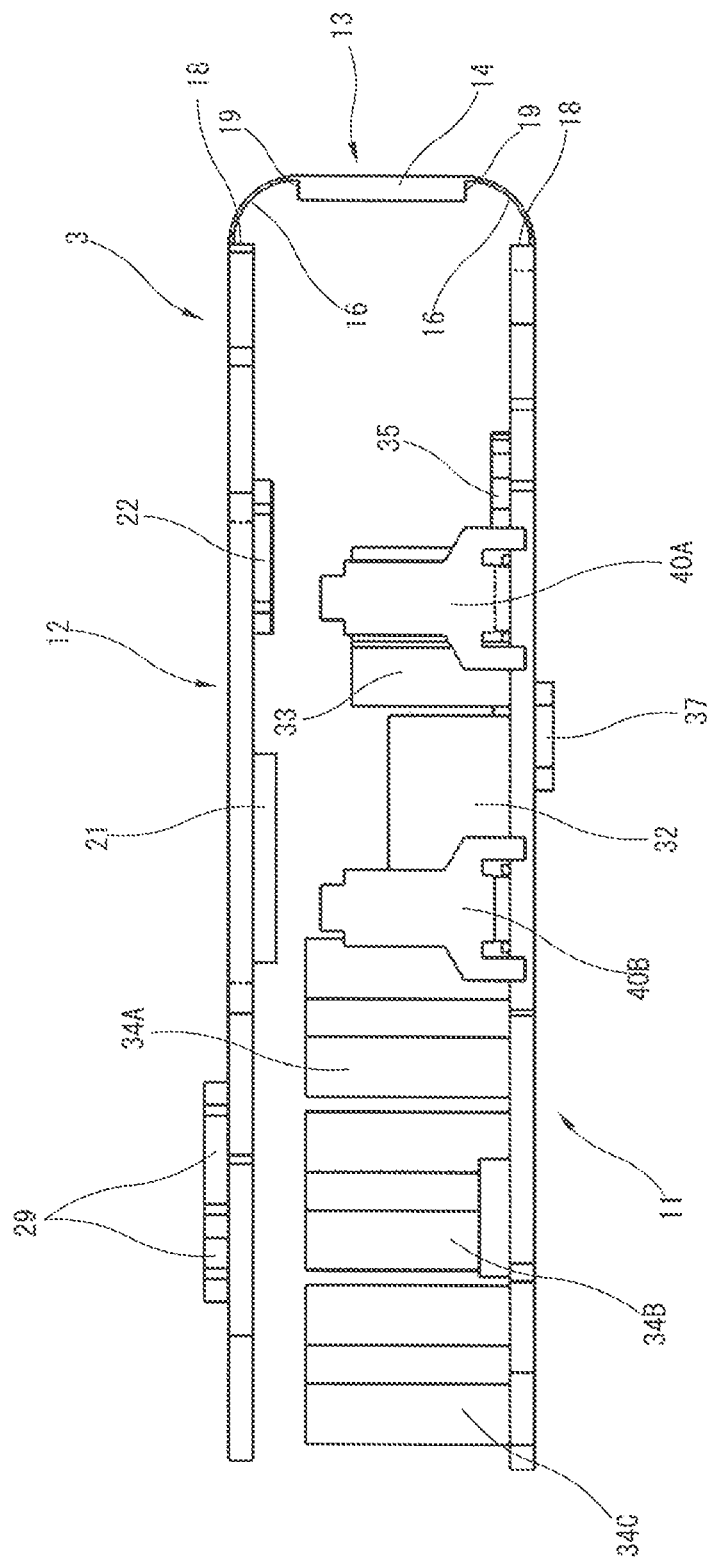
FIG. 4 is a side view of the circuit substrate in the bent state.

FIG. 3 is a perspective view and FIG. 4 is a side view each showing the outline of the circuit substrate 3 in a state of being bent in a substantially U-shape. As shown in FIG. 3 and FIG. 4, the circuit substrate 3 is, as mentioned above, incorporated into the electric actuator device in a state of being bent in a substantially U-shape.

That is, the circuit substrate 3 is provided with a first rigid part 11 that is a power system substrate mounting electronic component groups through which a relative large current flows for driving the motor 1A via the inverter power module 2, a second rigid part 12 that is a control substrate mounting control electronic components through which a relatively small current flows, and a flexible part 13 arranged between the first rigid part 11 and the second rigid part 12. The first rigid part 11 corresponds to a first component mounting part, and the second rigid part 12 corresponds to a second component mounting part. The circuit substrate 3 is accommodated between the motor cover 5 and the housing 7 serving as a case, in a state in which the flexible part 13 is flexibly deformed so as to have a shape in which the first rigid part 11 and the second rigid part 12 are superposed to each other in the axial direction of the rotation shaft 6. Specifically, in an embodiment, the first rigid part 11 and the second rigid part 12 are fixed to and supported by the electric actuator device in a state of being bent so as to be away from each other by a distance in which the electronic components mounted on the first rigid part 11 do not come in contact with the electronic components mounted on the second part 12, in a state in which they are parallel to each other while keeping a plane state.

Figure 5:
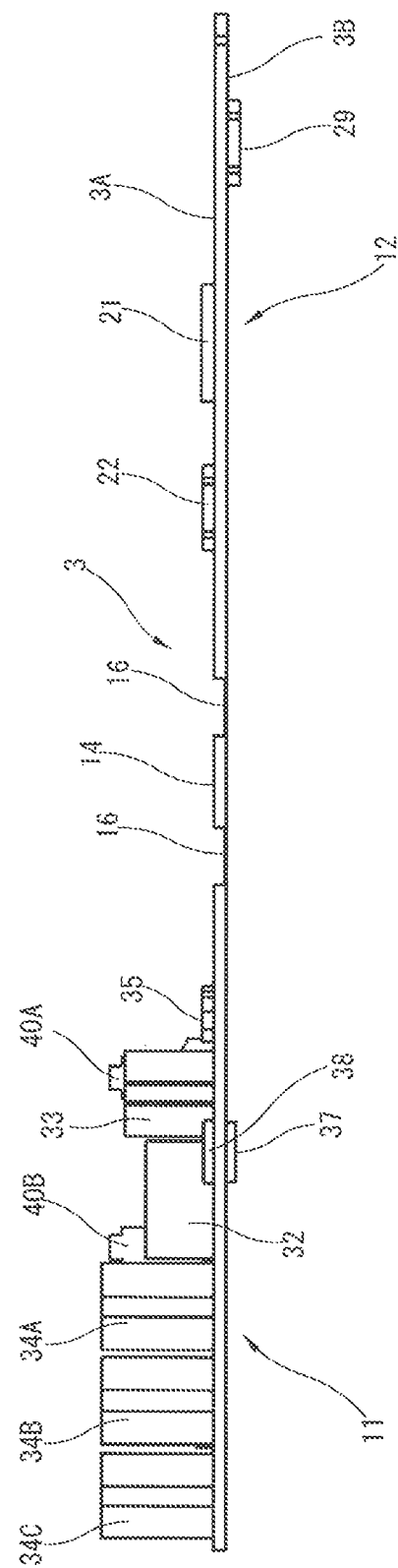
FIG. 5 is a sectional view of the circuit substrate in a state of being unfolded.
Figure 6:
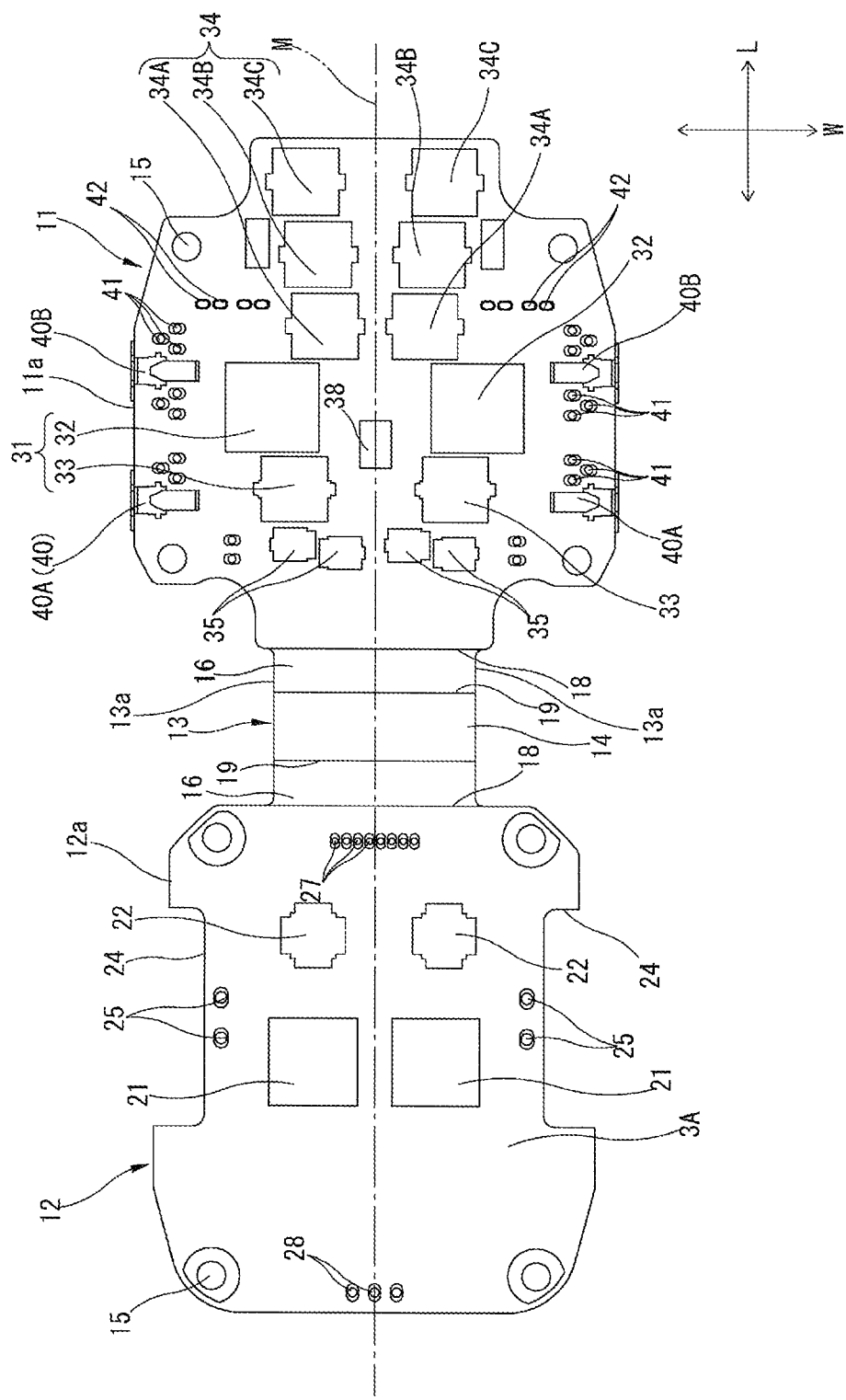
FIG. 6 is a plane view showing a first surface of the circuit substrate in the unfolded state.
Figure 7:
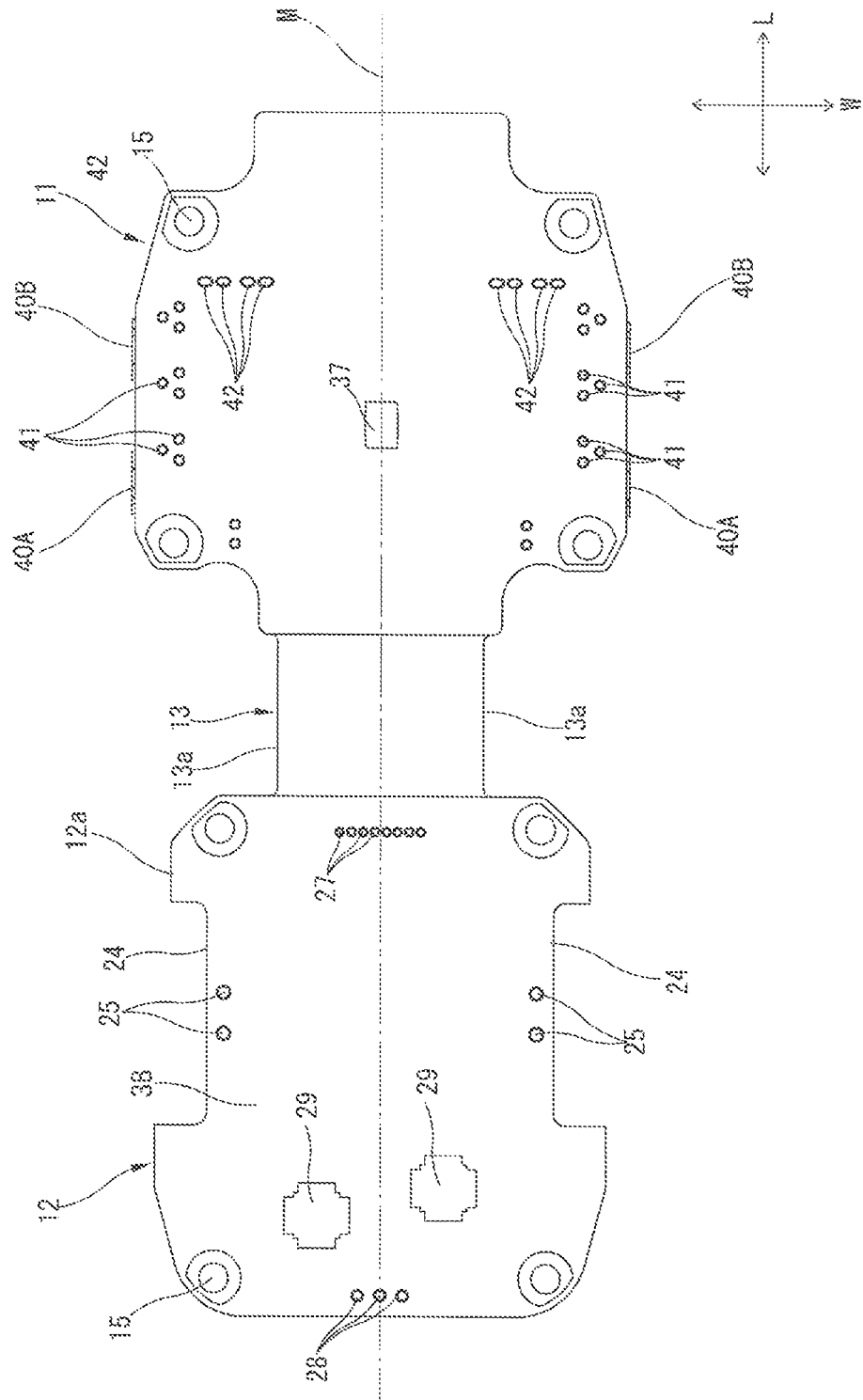
FIG. 7 is a plane view showing a second surface of the circuit substrate in the unfolded state.

FIG. 5 is a sectional view showing a state in which the circuit substrate 3 is unfolded, namely, a state before being bent (hatching of a substrate part is omitted). The circuit substrate 3 formed of one multilayer wiring substrate is provided with a first surface 3A and a second surface 3B. FIG. 6 is a plane view showing the configuration of the first surface 3A in a state in which the circuit substrate 3 is unfolded, and FIG. 7 is a plane view showing the configuration of the second surface 3B. The circuit substrate 3 is formed as one circuit substrate in which the first rigid part 11, the second rigid part 12 and the flexible part 13 are arranged along one plane in a state shown in FIG. 5 to FIG. 7, and is, in the end, bent in a substantially U-shape after components are mounted thereon.

Each of the first rigid part 11 and the second rigid part 12 has a shape similar to a square shape, and the four corners of each of the first rigid part 11 and the second rigid part 12 are provided with respective attachment holes 15. In addition, the middle of one side of the first rigid part 11 and the middle of one side of the second rigid part 12 which are adjacent to each other are connected to each other by the belt-shaped flexible part 13 having a fixed width. That is, the width of the flexible part 13 is narrower than the width (dimension in the direction orthogonal to the bending direction) of each of the first rigid part 11 and the second rigid part 12. Therefore, as a whole, the circuit substrate 3 has an I-shape or a shape of 8. In this way, the circuit substrate 3 is configured such that the width of each of the first and second rigid parts 11, 12 is relatively wide, and the width of the flexible part 13 is relatively narrow, and thereby it is possible to secure a large component mounting area, and the flexible deformation of the flexible part 13 can be easily carried out.

The circuit substrate 3 is formed of a multilayer printed wiring substrate, specifically, a so-called printed wiring substrate having a six-layer structure having six metal foil layers. The multilayer printed wiring substrate is formed by laminating, for example, several layers of glass epoxy substrates each having, one or both of the surfaces thereof, a metal foil layer via prepreg (adhesive layer), so as to be integrated by heating pressurization. Accordingly, six metal foil layers that become wiring layers are formed which are composed of the metal foil layer as a surface layer of each of the first surface 3A and the second surface 3B and four metal foil layers as inner layers. Substrates as insulation layers are interposed between the metal foil layers so as to insulate between the metal foil layers. In addition, in the first rigid part 11 and the second rigid part 12, by the etching of the six metal foil layers and the formation of vias extending in the lamination direction, a desired circuit pattern is formed.

As is clear from FIG. 4, the width (dimension in the lamination direction) of the substrate of the flexible part 13 is relatively thin as compared with the width of the substrates of the first rigid part 11 and the second rigid part 12 each having a six-layer structure, and thereby the flexible part 13 has a higher flexibility than that of the first rigid part 11 and the second rigid part 12. In one embodiment, for example, the circuit substrate 3 having a six-layer structure is formed in a rectangular shape including the first rigid part 11, the second rigid part 12 and the flexible part 13, following which, by secondary machining, four layers positioned on the inner side in the flexible part 13 at the time of the bending are removed so as to be thin. Therefore, the material of each of the substrates of the first and second rigid parts 11, 12 is the same as that of the substrate of the flexible part 13, and the remaining two metal foil layers as the flexible part 13 are continued over the first and second rigid parts 11, 12 and the flexible part 13.

In addition, in the illustrated example, a middle rigid part 14 having a six-layer structure is left in the middle part of the flexible part 13 in order to ensure a printing surface of, for example, a bar code, and a thin part, as a recessed groove 16, is formed on each of the both sides of the middle rigid part 14. This middle rigid part 14 is not always needed, and the whole of the flexible part 13 can be formed thin. In the present embodiment, the whole area between the first rigid part 11 and the second rigid part 12 including the middle rigid part 14 is referred to as a flexible part 13.

As is clear from FIG. 5 and FIG. 6, the recessed grooves 16 are each recessed in a groove shape in the first surface 3A of the circuit substrate 3. In the second surface 3B, the flexible part 13 has a surface continuous with the first and second rigid parts 11, 12.

The recessed grooves 16 in a pair for giving flexibility required for the flexible part 13 are formed along respective one side of the first rigid part 11 and one side of the second rigid part 12, and with this, boundaries 18 between the first and second rigid parts 11, 12 and the flexible part 13 are defined. In other words, by the edges on the outer sides of the thin recessed grooves 16, a pair of the linear boundaries 18 are defined, and when being bent as shown in FIG. 4, the thin flexible part 13 is flexibly deformed between a pair of the boundaries 18. The width (dimension in the direction orthogonal to the bending direction) of the circuit substrate 3 decreases at the boundaries 18 between the first and second rigid parts 11, 12 and the flexible part 13. The flexible part 13 is formed in a belt shape having a fixed width so as to be flexibly deformed easily. In addition, in order to suppress stress concentration due to the decreasing of the width at each of the boundaries 18, at the corners of the both ends of each of the boundaries 18 at which the first and second rigid parts 11, 12 are connected to the flexible part 13, the flexible part 13 is rounded in an arc shape having an appropriate diameter (see FIG. 5 and FIG. 6).

In the flexible part 13 (in the recessed grooves 16), of the six metal foil layers, a surface metal foil layer on the second surface 3B side which is positioned on the outer side when being bent and an inner metal foil layer (that is, a second layer when viewed from the second surface 3B side) adjacent to the surface metal layer are left. In the flexible part 13, only these two metal foil layers are used for forming a wiring pattern. In the first and second rigid parts 11, 12, further four metal foil layers are used for forming a wiring pattern. In addition, although the middle rigid part 14 has six metal foil layers, metal foil layers corresponding to a third to sixth layers when viewed from the second surface 3B side are not used for forming a wiring pattern.

Similarly, linear boundaries 19 also exist between a pair of the recessed grooves 16 and the middle rigid part 14. The four boundaries 18, 19 of a pair of the boundaries 18 and a pair of the boundaries 19 are arranged parallel to each other.

Figure 8:
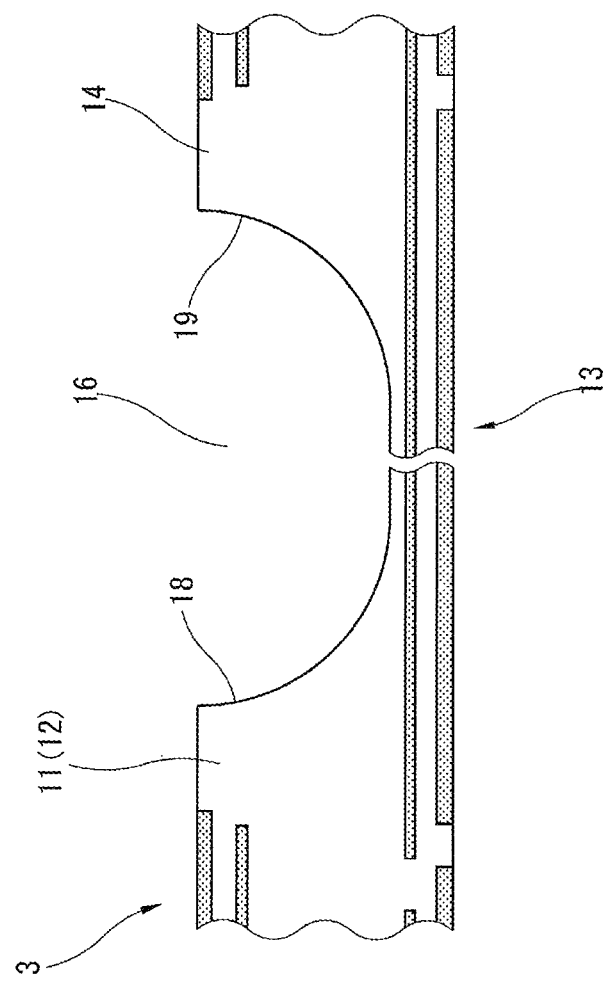
FIG. 8 is an enlarged sectional view showing a flexible part in a variation.

Here, FIG. 8 shows one variation of the recessed grooves 16. In this variation, in each of the boundaries 18, 19, the thickness of the substrate smoothly, namely, continuously changes. For example, in each of the boundaries 18 between the first and second rigid parts 11, 12 and the recessed grooves 16 (flexible part 13), the thickness of the insulation substrate gradually decreases such that the thickness of the substrate continuously changes from the thickness of the first and second rigid parts 11, 12 to the thickness of the flexible part 13. Similarly, in each of the boundaries 19 between the middle rigid part 14 and the recessed grooves 16, the thickness of the insulation substrate gradually decreases such that the thickness of the substrate continuously changes from thickness of the middle rigid part 14 to the thickness of the flexible part 13.

In this way, the thickness smoothly changes, and the stress concentration in the boundaries 18, 19 is suppressed, and the occurrence of cracks is suppressed.

Next, a main configuration of the layout of various components in the circuit substrate 3 will be explained. In addition, in the following, in order to facilitate understanding, the longitudinal direction of the circuit substrate 3 in the unfolded state is referred to as an L direction as shown in FIG. 6 and FIG. 7, and the width direction orthogonal to the L direction is referred to as a W direction. A pair of the boundaries 18 of the flexible part 13 mentioned above is each a straight line extending in the W direction. If a straight line along the L direction was drawn on the circuit substrate 3 in the unfolded state, in a state in which the circuit substrate 3 was bent in a substantially U-shape, by the straight line on the first rigid part 11 and the straight line on the second rigid part 12, one plane (plane orthogonal to the boundaries 18) would be specified. Moreover, for convenience of explanation, as shown in FIG. 6 and FIG. 7, a line intersecting the rotation center axis of the motor 1A at the time of the assembling and extending parallel to the L direction is referred to as a substrate center line M.

The circuit substrate 3 in this embodiment is equipped with two control systems independent of each other which correspond to two-system coils of the motor 1A. When failures or errors occur to one of the systems, the drive of the motor 1A can be carried out by the other of them. Basically, each of the control systems is configured such that components are arranged on the circuit substrate 3 along the L direction that is the longitudinal direction, and, basically, the two control systems are configured so as to be arranged side by side in the W direction that is the width direction of the circuit substrate 3. Except the differences in details of parts, the two control systems are configured so as to be symmetrical with respect to the substrate center line M as a center.

As shown in FIG. 6, in the first surface 3A of the first rigid part 11, two filter parts 31 for removing noise are arranged near the center part in the L direction of the first rigid part 11, and two power capacitors 34 are arranged at the positions more on the opposite side of the flexible part 13 than the filter parts 31. That is, one control system includes one filter part 31 and one power capacitor 34. Each of the filter parts 31 is composed of a coil 32 equipped with a rectangular case and a capacitor 33 equipped with a rectangular case at a position closer to the flexible part 13 than to the coil 32. In addition, each of the power capacitors 34 is composed of, for example, three capacitors 34A, 34B, and 34C each equipped with a rectangular case. An electronic component group composing one control system, namely, a capacitor 33, a coil 32 and capacitors 34A, 34B, 34C are arranged, in this order, not in a complete straight line but substantially in a line in the L direction. Then, a capacitor 33, a coil 32 and capacitors 34A, 34A, 34C composing one of the control systems, and a capacitor 33, a coil 32 and capacitors 34A, 34A, 34C composing the other of them are arranged so as to be symmetrical with respect to the substrate center line M.

In addition, two power cut-off switching elements 35 are mounted between the capacitor 33 of one of the control systems and the flexible part 13 and two power cut-off switching elements 35 are mounted between the capacitor 33 of the other of them and the flexible part 13, and a total of four power cut-off switching elements 35 are mounted. The two power cut-off switching elements 35 of each of the control systems are arranged adjacent to a corresponding one of the capacitors 33. In addition, the four power cut-off switching elements 35 in total are arranged in a substantially straight line along the W direction.

In the first surface 3A of the first rigid part 11, as a detection element for detecting the operation condition of the motor 1A, a second rotation sensor 38 is mounted between the electronic component groups of the two control systems, specifically, between the two filter parts 31. This second rotation sensor 38 is an analog rotation sensor for detecting the rotation of the rotation shaft 6 by being combined with a magnetic pole provided to an end portion of the rotation shaft 6 of the motor 1A, and is arranged at a position on the center axis line of the rotation shaft 6 at the time when being assembled. This second rotation sensor 38 is one shared by the two control systems, and the detection signal thereof is branched into two signal circuits on the first rigid part 11 so as to be used in the respective control systems.

First power source terminals 40 are attached to a pair of respective side edge portions 11a directed in the W direction of the first rigid part 11. Each of the first power source terminals 40 includes a positive terminal 40A and a negative terminal 40B, and one set of a first power source terminal 40 composed of a first terminal 40A and a negative terminal 40B corresponds to one of each of the control systems. The power source terminals 40 are positioned more on the outer side than the electronic component groups (namely, capacitors 33, coils 32, and capacitors 34A, 34B, 34C) composing the respective control systems, in the W direction.

the positive terminals 40A and the negative terminals 40B are each made from a metal piece bent in a substantially L-shape, and are provided along the side edges of the first rigid part 11 so as to stand orthogonal to the first surface 3A from the first surface 3A. The positive terminals 40A and the negative terminals 40B are arranged along the L direction, and the positive terminals 40A are positioned closer to the flexible part 13 than to the negative terminals 40B. Specifically, each of the positive terminals 40A is positioned on the side of a corresponding one of the capacitors 33 of the filter parts 31, and each of the negative terminals 40B is positioned on the side of a corresponding one of the coils 32 of the filter parts 31. In a final assembled state as an electric actuator device, the first power source terminals 40 are connected to respective terminal pieces of the power source connector 4a of the connector member 4 mentioned above. In addition, two sets of the first power source terminals 40 are configured so as to be symmetrical to each other with respect to the substrate center line M as a center.

the first rigid part 11 is further provided with gate signal ports 41 connected to switching elements of arms of the inverter power module 2, and inverter power source ports 42 for supplying power source voltage to the inverter power module 2. Each of these ports is formed as a terminal having a through whole shape. The gate signal ports 41 are arranged adjacent to the first power source terminals 40, and the inverter power source ports 42 are arranged on the sides (outside in the W direction) of the power capacitors 34. In a final assembled state as an electric actuator device, pin-shaped terminal pieces of the inverter power module 2 are inserted into and electrically connected to these ports 41, 42.

In the first surface 3A of the second rigid part 12, two CPUs 21 corresponding to the respective two control systems are mounted near the center part in the L direction of the second rigid part 12. Each of the CPUs 21 is composed of an integrated circuit including a substantially square flat package. The two CPUs 21 are arranged symmetrically with respect to the substrate center line M as a center. Pre-driver circuit elements 22 are mounted at positions closer to the flexible part 13 than to the two CPUs 21. Each of the pre-driver circuit elements 22 is composed of an integrated circuit including a substantially square flat package smaller than each of the CPUs 21. The two pre-driver circuit elements 22 correspond to the respective two control systems, and are arranged symmetrically with respect to the substrate center line M as a center. Each of the pre-driver circuit elements 22 is arranged alongside a corresponding one of the CPUs 21 of the control systems along the L direction.

Cutout parts 24 for avoiding interference with the above-mentioned first power source terminals 40 of the first rigid part 11 in a bent state are formed at a pair of respective side edge parts 12a directed in the width direction of the second rigid part 12. These cutout parts 24 are positioned at substantially the respective sides of the pre-driver circuit elements 22 and the CPUs 21. Two positive and negative second power source terminals 25 formed by through holes are provided at positions along each of the cutout parts 24. These two sets of the second power source terminals 25 correspond to the respective control systems. In a final assembled state as an electric actuator device, the pin-shaped terminal pieces of the power source connector 4a of the connector member 4 are inserted into and electrically connected to the through-hole-shaped second power source terminals 25.

a plurality of external sensor input parts 27 formed by through-hole-shaped terminals are provided in an end part region close to the flexible part 13 of the second rigid part 12. A plurality of the through-hole-shaped terminals are arranged on a straight line along the W direction. In a final assembled state as an electric actuator device, the pin-shaped terminal pieces of the sensor input connector 4b of the connector member 4 are inserted into the external sensor input parts 27, such that signals of external sensors, such as a steering angle sensor and a torque sensor, are input to each of the control systems via the external sensor input parts 27.

In addition, a plurality of communication ports 28 formed by through-hole-shaped terminals are provided in an end part region on the opposite side of the flexible part 13 in the second rigid part 12. A plurality of the through-hole-shaped terminals are arranged on a straight line along the W direction. In a final assembled state as an electric actuator device, the pin-shaped terminal pieces of the communication connector 4c of the connector member 4 are inserted into the communication ports 28, so as to communicate with other external control apparatuses.

As shown in FIG. 7, in the second surface 3B of the first rigid part 11, a first rotation sensor 37 as a detection element for detecting the operation condition of the motor 1A is mounted in the middle part thereof. This first rotation sensor 37 is a digital rotation sensor for detecting the rotation of the rotation shaft 6 by being combined with a magnetic pole provided to an end portion of the rotation shaft 6 of the motor 1A, and is arranged at a position on the center axis line of the rotation shaft 6 at the time when being assembled. Similar to the second rotation sensor 38, this first rotation sensor 37 is one shared by the two control systems, and the detection signal thereof is branched into two signal circuits on the first rigid part 11 so as to be used in the respective control systems.

The first rotation sensor 37 disposed on the second surface 3B and the second rotation sensor 38 disposed on the first surface 3A are arranged at a position at which the first rotation sensor 37 and the second rotation sensor 38 are superimposed on each other when the circuit substrate 3 is projected. In a final assembled state as an electric actuator device, the first rotation sensor 37 is positioned on the outer side surface of the circuit substrate 3 having a substantially U shape, so as to face an end surface of the rotation shaft 6. The second rotation sensor 38 is positioned on the inner side of the circuit substrate 3 having a substantially U shape. In one embodiment, the first rotation sensor 37 is a main rotation sensor, and the second rotation sensor 38 is an auxiliary rotation sensor used when, for example, the first rotation sensor 37 is abnormal.

In addition, one of the rotation sensors respectively disposed on the first surface 3A and the second surface 3B may be used for one of the control systems, and the other of them may be used for the other of the control systems, so as to be used independently of one another.

In the second surface 3B of the second rigid part 12, two power source communication ICs 29 each composed of an integrated circuit including a power circuit for the second rigid part 12 and a communication circuit for the communication ports 28 are mounted thereon. Each of the power source communication ICs 29 has a substantially square flat package having a size smaller than that of each of the CPUs 21. The two power source communication ICs 29 correspond to the respective two control systems, and are arranged at positions so as to be substantially symmetrical with respect to the substrate center line M as a center. In the L direction, each of the power source communication ICs 29 is positioned in an end part region on the opposite side of the flexible part 13 in the second rigid part 12, and is positioned between the second power source terminals 25 and the communication ports 28. In addition, when the second rigid part 12 is projected, the power source communication ICs 29 are positioned between the CPUs 21 and the communication ports 28, and the CPUs 21 are positioned closer to the flexible part 13 than to the power source communication ICs 29. The CPUs 21 are therefore positioned in the middle part between the power source communication ICs 29 and the external sensor input parts 27.

The power source communications ICs 29 communicate with other external control apparatuses via the communication ports 28, and convert terminal voltage input to the second power source terminals 25 into operation voltage for the second rigid part 12. In addition, the power circuit and the communication circuit may be composed by respective individual integrated circuits.

As the above, although the arrangement of the main electronic components has been explained, in addition to the above electronic components, a plurality of relatively small electronic components which are not shown are surface-mounted on the first rigid part 11 and the second rigid part 12.

The detection signals of the first rotation sensor 37 and the second rotation sensor 38 disposed on the first rigid part 11 are supplied toward the second rigid part 12 equipped with the CPUs 21 via wirings (sensor signal wirings) each provided in a straight line in the flexible part 13.

In the circuit substrate 3 in one embodiment, two-system control systems corresponding to respective two-system coils of the motor 1A are configured so as to be independent of each other, and these two control systems are arranged so as to be substantially symmetrical with respect to the substrate center line M as a center which extends across the first and second rotation sensors 37, 38. One control system will be explained. The detection signals of the first and second rotation sensors 37, 38 which respond to the rotation of the motor 1A are sent from the first rigid part 11 to the second rigid part 12 via sensor signal wirings in the flexible part 13. A CPU 21 of the second rigid part 12 performs operation processing using the detection signals as one parameter, calculates the operation amount for the motor 1A, and generates an instruction signal based on the calculated operation amount. The instruction signal is amplified by a pre-driver circuit element 22, and is converted into a control signal for an inverter circuit. This control signal is sent from the second rigid part 12 to the first rigid part 11 via wirings (drive signal wirings) arranged in straight lines on the flexible part 13, and in the end, as a gate signal, it is output from gate signal ports 41 of the first rigid part 11 to the inverter power module 2. The inverter power module 2 is supplied with power supply voltage from a first power source terminal 40 of the first rigid part 11 via power cut-off switching elements 35, a filter part 31, a power capacitor 34 and inverter power source ports 42, and by inverter action based on the gate signal, the motor 1A is driven.

A plurality of sensor signal wirings and a plurality of drive signal wirings are formed in parallel straight lines along the L direction. In the following, as needed, both of them are referred to as "inter-rigid-part wiring" (corresponding to inter-component-mounting-part wiring in claims). Inter-rigid-part wirings include, in addition to the above sensor signal wirings and the like, a plurality of wirings for performing the transfer of signals between the first rigid part 11 and the second rigid part 12, and power source positive electrode wirings which are not shown in the drawings are also included.

Here, since an electronic component group (a capacitor 33, a coil 32, and capacitors 34A, 34B, 34C) of the first rigid part 11 and a CPU 21 of the second rigid part 12 composing one control system are arranged along the wiring direction (that is, L direction) of signal wirings in the flexible part 13, the interference between electronic components in a layout and the complication of wiring patterns (for example, the forming of a plurality of bypass circuits) between components can be suppressed, and thereby each control system can be efficiently arranged in the circuit substrate 3 having a limited area and divided by the flexible part 13. In particular, in the above embodiment, since two control systems are arranged so as to be symmetrical with respect to the substrate center line M, in association with the arrangement of each of the control systems along the wiring direction of the signal wirings, the two control systems can be efficiently arranged. In addition, individual control systems are configured so as to be long and narrow along the wiring direction (that is, L direction) of the signal wirings, and consequently, as a whole, the wiring routes in the control systems tend to be linearized along the L direction, and an increase in a wiring length due to the complication of the wiring routes is suppressed. With this, noise immunity is improved.

In addition, since the rotation sensors 37, 38 are arranged so as to be sandwiched between the lines of the electronic component groups (capacitors 33, coils 32, and capacitors 34A, 34B, 34C) of the two control systems in the first rigid part 11, and the sensor signal wirings extend from the rotation sensors 37, 38 toward the flexible part 13 side along the substrate center line M, the crossing of each of the signal wirings can be suppressed.

In the flexible part 13, the sensor signal wirings and the drive signal wirings are each aligned on a metal foil layer that becomes a surface layer or an inner layer, and extend parallel to each other, and thereby a plurality of wirings can be wired, in a simplified form, on the flexible part 13 having a limited width. That is, a highly densified wiring can be achieved. In addition, a ground wiring having a relatively wide width can be provided on a metal foil layer that becomes a surface layer or an inner layer.

By the existence of the ground wiring having a wide width in the flexible part 13, bending strength in the flexible part 13 is improved. In particular, by setting the positions of the outer edges of the ground wiring so as to be closer to side edges 13a of the flexible part 13 than to the positions of the signal wirings, the ground wiring functions as a reinforcing member, so as to protect the signal wirings from cracks which tend to occur at the side edges 13a of the flexible part 13.

In addition, the ground wiring is conducted to a terminal on the ground side of the power source connector 4a via the first rigid part 11 or the second rigid part 12, or may be conducted toward a vehicle body which is not shown in the drawings via screw members inserted through the attachment holes 15 and the housing 7 (see FIG. 1).

Next, some embodiments regarding layouts of signal wirings and a ground wiring in the flexible part 13 that is a main part of the present invention will be explained.

Figure 9:
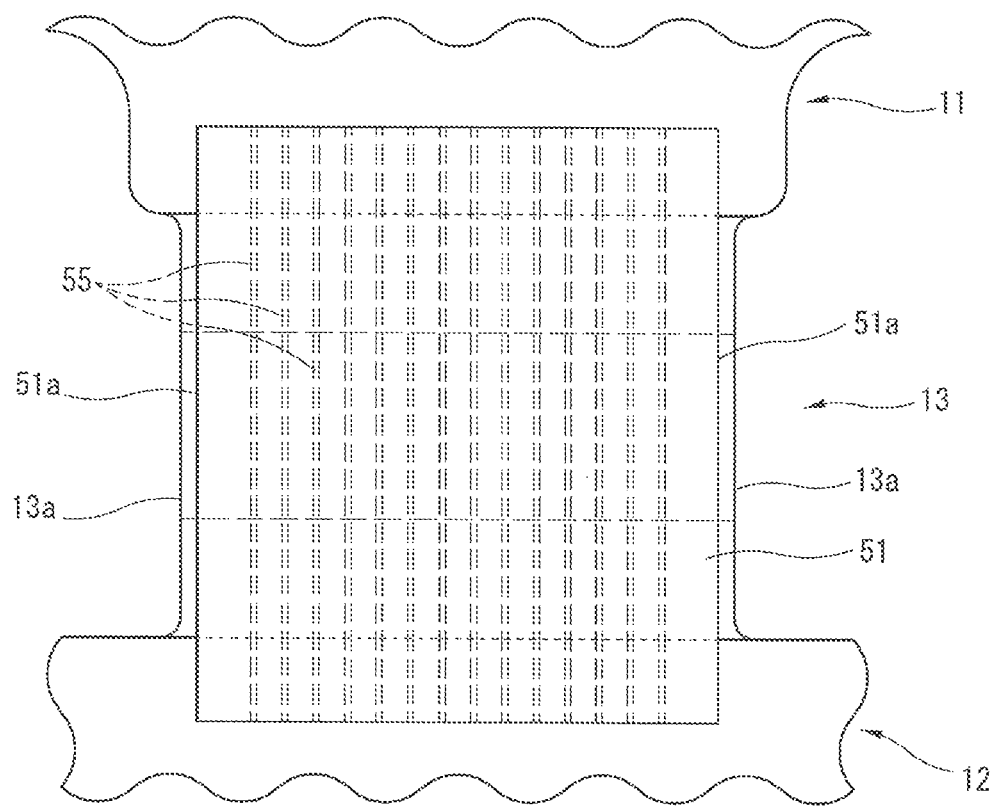
FIG. 9 is a plane view of a main part showing a first embodiment of the wiring in a flexible part.
Figure 10:
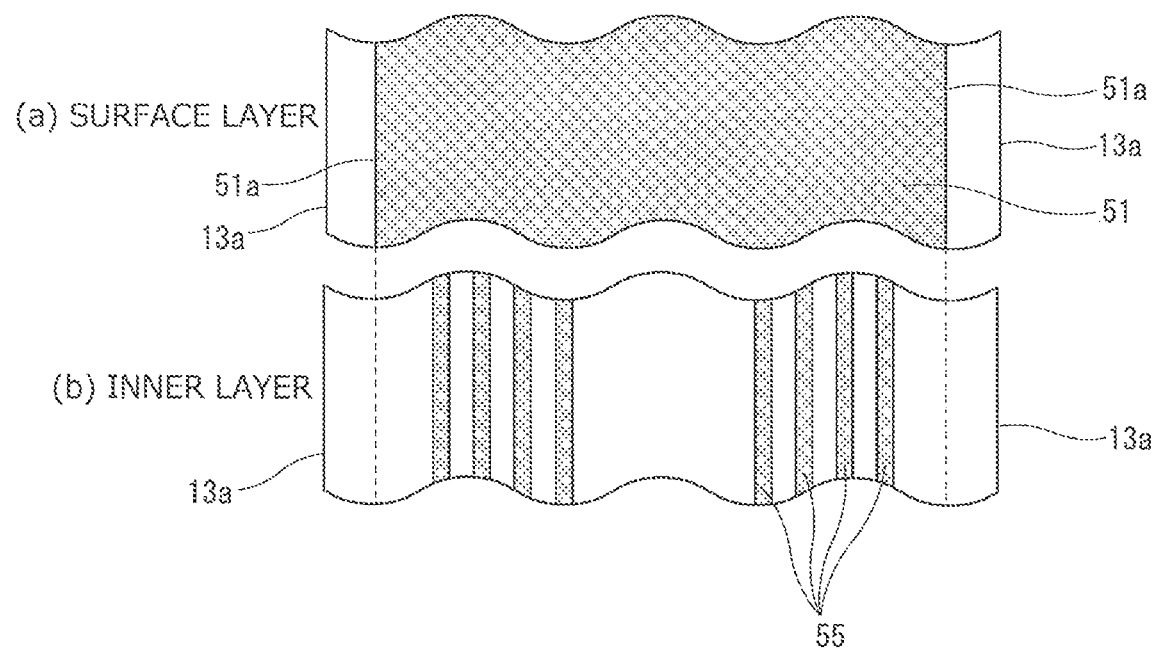
FIG. 10 is an illustrative view schematically showing the configuration of the wiring in the first embodiment.

FIG. 9 and FIG. 10 each show a first embodiment. FIG. 9 is a plane view of the flexible part 13 viewed from the second surface 3B side that becomes an outer side surface when the flexible part 13 is bent, and FIG. 10 is an illustrative view schematically showing each of the wiring of a surface layer and the wiring of an inner layer of the flexible part 13.

In the first embodiment, a ground wiring 51 which is shaped like a wide strip is formed on a metal foil layer that becomes a surface layer on the second surface 3B side, and a plurality of inter-rigid-part wirings 55 including sensor signal wirings and drive signal wirings are formed on a metal foil layer that becomes an inner layer so as to be parallel to each other. The ground wiring 51 has a width which occupies the almost entire width (dimension in the W direction) of the flexible part 13, and outer edges 51a of the ground wiring 51 along side edges 13a of the flexible part 13 are positioned close to the side edges 13a of the flexible part 13. In addition, a plurality of the inter-rigid-part wirings 55 including sensor signal wirings and drive signal wirings are positioned more on the inner side in the W direction than a pair of the outer edges 51a of the ground wiring 51. That is, when the flexible part 13 is projected in the thickness direction, the outer edges 51a of the ground wiring 51 are positioned closer to the side edges 13a of the flexible part 13 than to the inter-rigid-part wirings 55.

By configuring the ground wiring 51 and the inter-rigid-part wirings 55 in this way, the ground wiring 51 functions as a reinforcing member, and thereby the occurrence of cracks which tend to occur at the side edges 13a of the flexible part 13 is suppressed. In addition, even if the cracks occur, the increasing of the cracks is suppressed by the ground wiring 51, and the cracks hardly reach to the inter-rigid-part wirings 55. Therefore, insulating failure due to the infiltration of moisture to the inter-rigid-part wirings 55 and the disconnection of the inter-rigid-part wirings 55 are suppressed.

In addition, in a state in which the circuit substrate 3 is bent, stress in an area close to the surface layer which becomes an outer side surface at the time of the bending becomes higher than that in an area close to the inner layer. Therefore, in the first embodiment, the wide ground wiring 51 is arranged on the surface layer where stress is high, and consequently, the occurrence of cracks in an area close to the surface layer is efficiently suppressed.

Figure 11:
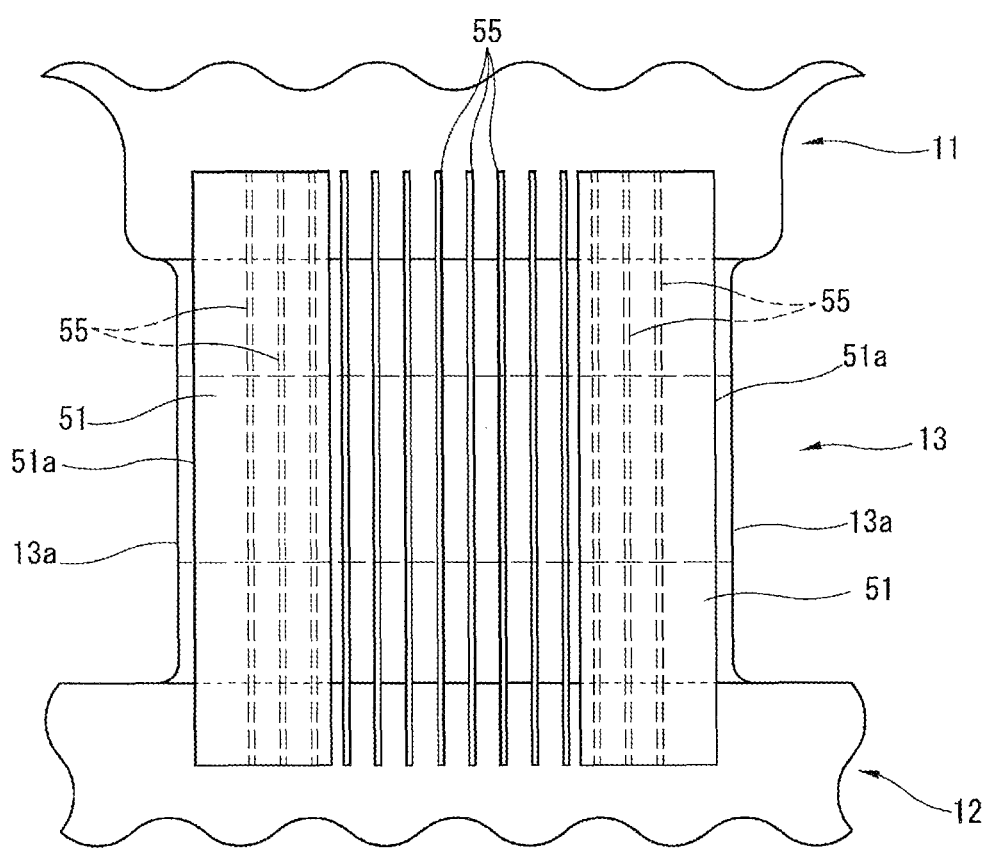
FIG. 11 is a plane view of a main part showing a second embodiment of the wiring in the flexible part.
Figure 12:
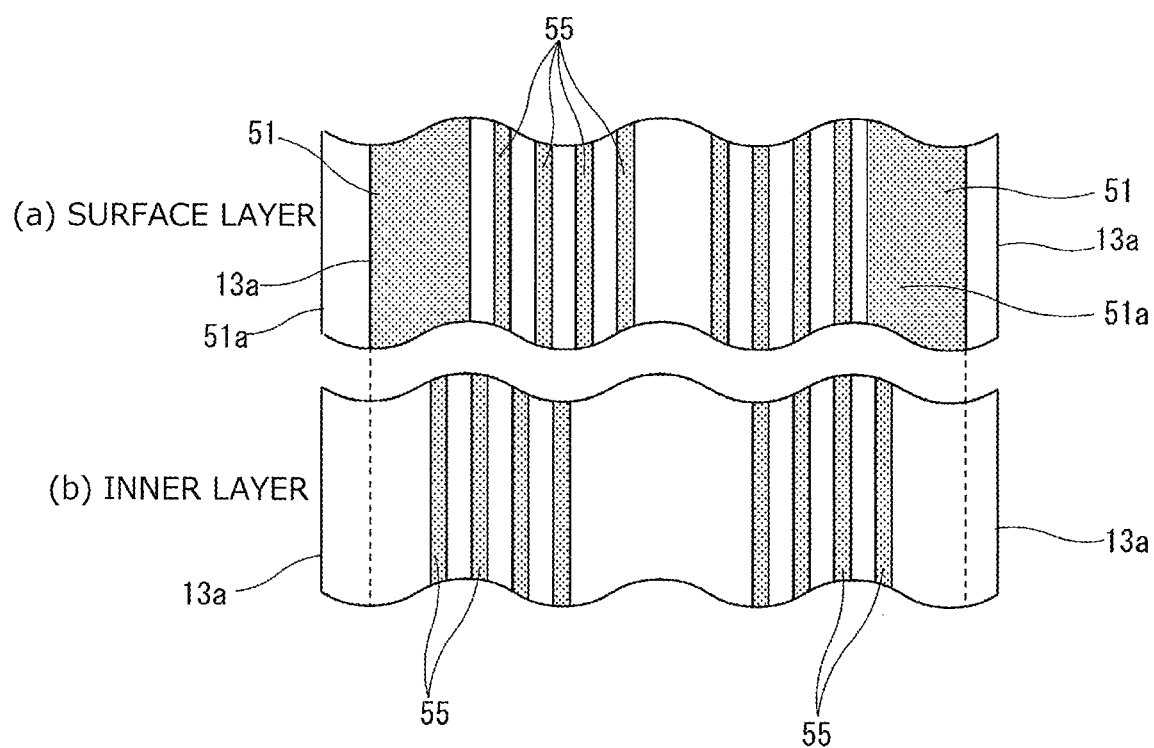
FIG. 12 is an illustrative view schematically showing the configuration of the wiring in the second embodiment.

FIG. 11 and FIG. 12 each show a second embodiment. FIG. 11 is a plane view of the flexible part 13 viewed from the second surface 3B side that becomes an outer side surface at the time when the flexible part 13 is bent. FIG. 12 is an illustrative view schematically individually showing the wiring on a surface layer and the wiring of an inner layer of the flexible part 13.

In the second embodiment, a pair of ground wirings 51 and a plurality of inter-rigid-part wirings 55 are formed on the surface layer on the second surface 3B side, and the inner layer is formed with a plurality of inter-rigid-par wirings 55.

In the surface layer, a pair of the ground wirings 51 is positioned on the outer side in the width direction (W direction) of the flexible part 13, and a plurality of the inter-rigid-part wirings 55 are arranged on the inside side of the two ground wirings 51. Each of the ground wirings 51 is formed so as to have a width wider than that of each of the inter-rigid-part wirings 55. In addition, outer edges 51a of the ground wirings 51 along side edges 13a of the flexible part 13 are positioned close to the side edges 13a of the flexible part 13.

In the inner layer, a plurality of the inter-rigid-part wirings 55 are arranged more on the inner side in the W direction than to the outer edges 51a of a pair of the ground wirings 51. That is, when the flexible part 13 is projected in the thickness direction, the outer edges 51a of the ground wirings 51 are positioned closer to the side edges 13a of the flexible part 13 than to the inter-rigid-part wirings 55.

In such a configuration, similar to the first embodiment, by a pair of the ground wirings 51, a plurality of the inter-rigid-part wirings 55 on the surface layer and the inner layer are protected from cracks. In the second embodiment, as compared with the first embodiment, a larger number of inter-rigid-part wirings 55 can be disposed.

In addition, the width of each of the ground wirings 51 may not always be wider than that of each of the inter-rigid wirings 55, and if each of the ground wirings 51 has at least substantially the same width as that of each of the inter-rigid-part wirings 55, an effect for suppressing the occurrence and increasing of cracks can be obtained.

Figure 13:
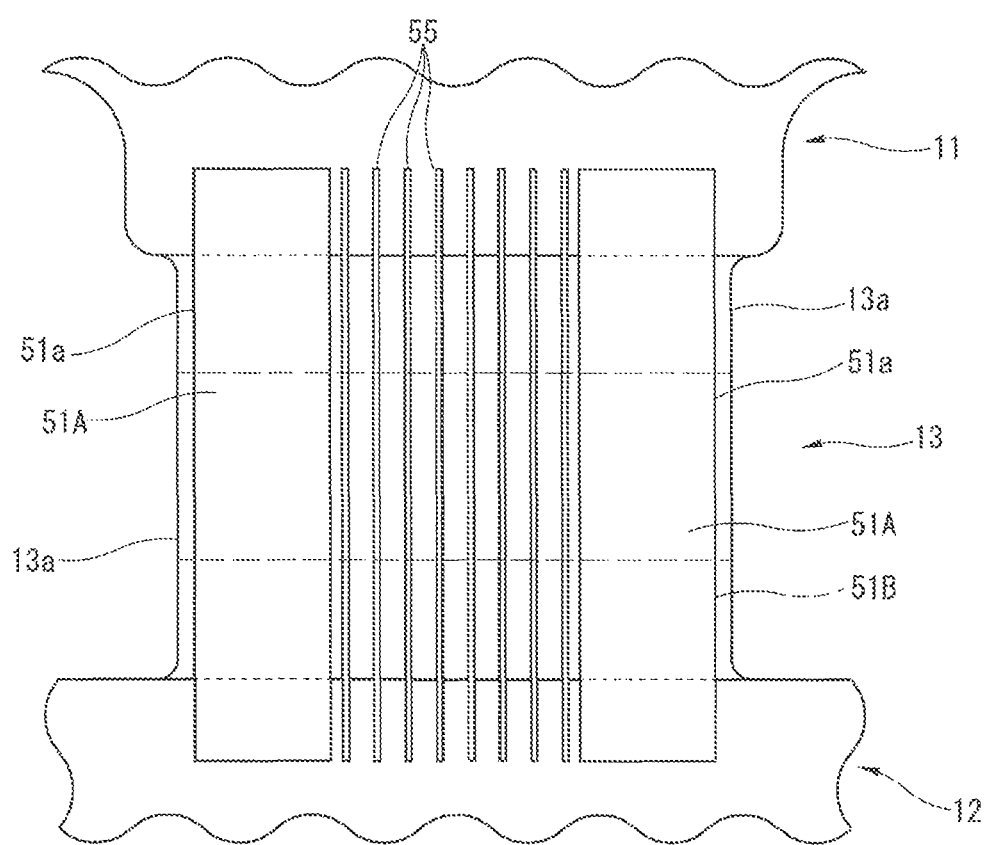
FIG. 13 is a plane view of a main part showing a third embodiment of the wiring in the flexible part.
Figure 14:
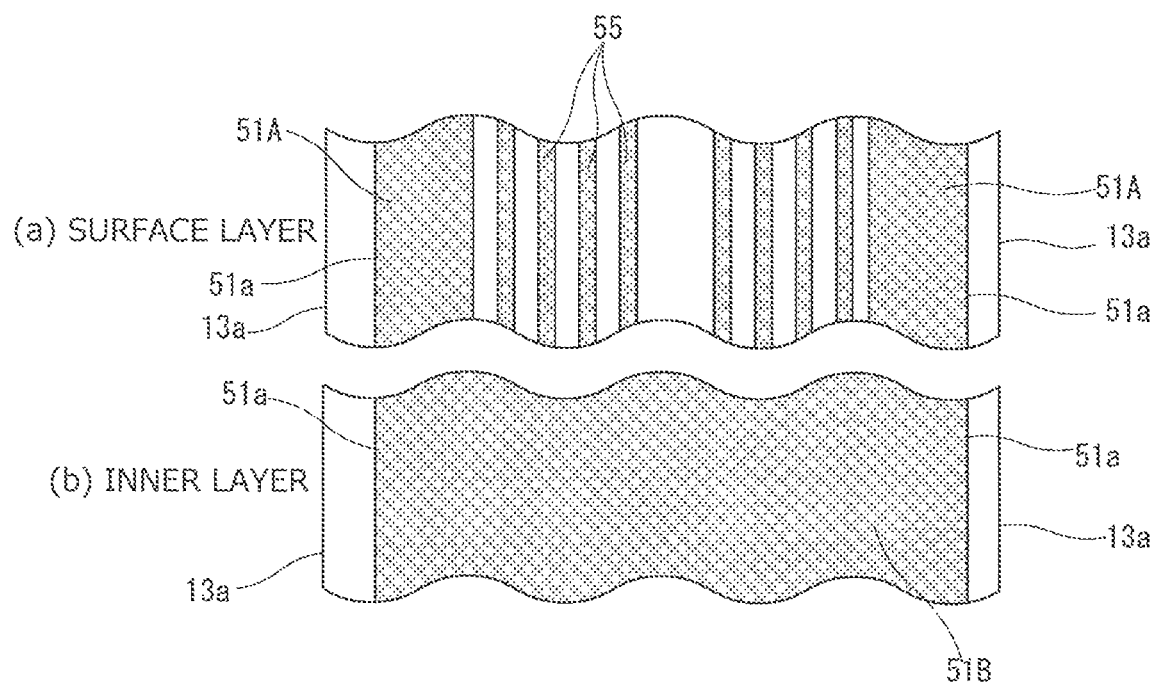
FIG. 14 is an illustrative view schematically showing the configuration of the wiring in the third embodiment.

FIG. 13 and FIG. 14 each show a third embodiment. FIG. 13 is a plane view of the flexible part 13 viewed from the second surface 3B side that becomes an outer side surface at the time when the flexible part 13 is bent. FIG. 14 is an illustrative view schematically individually showing the wiring on a surface layer and the wiring on an inner layer of the flexible part 13.

In the third embodiment, a pair of ground wirings 51A and a plurality of inter-rigid-part wirings 55 are formed on the surface layer on the second surface 3B side, and a ground wiring 51B which is shaped like a wide strip is formed on the inner layer.

In the surface layer, a pair of the ground wirings 51A is positioned on the outer side in the width direction (W direction) of the flexible part 13, and the inter-rigid-part wirings 55 are arranged on the inner side of the two ground wirings 51A. Each of the ground wirings 51A is formed so as to have a width wider than that of each of the inter-rigid-part wirings 55. In addition, outer edges 51a of the ground wirings 51A along side edges 13a of the flexible part 13 are positioned close to the side edges 13a of the flexible part 13.

The ground wiring 51B in the inner layer has a width which occupies the almost entire width (dimension in the W direction) of the flexible part 13, and outer edges 51a of the ground wiring 51B are located at positions substantially equal to the positions of the outer edges 51a of the ground wiring 51A.

In such a configuration, by both of the ground wirings 51A on the surface layer and the ground wiring 51B on the inner layer, the occurrence and the increasing of cracks are suppressed, and thereby the inter-rigid-part wirings 55 positioned on the inner side in the W direction are protected. In the third embodiment, as compared with the first embodiment, by the existence of the ground wirings 51A on the surface layer and the ground wiring 51B on the inner layer, the occurrence and the increasing of cracks are further surely suppressed.

Figure 15:
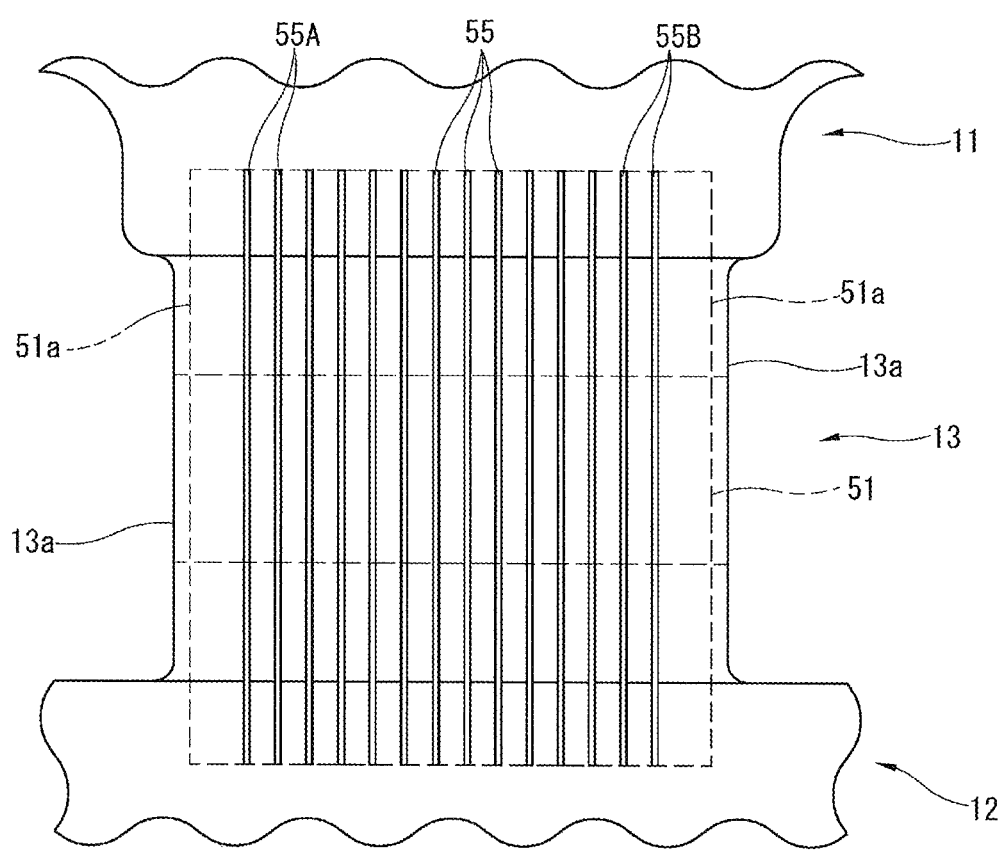
FIG. 15 is a plane view of a main part showing a fourth embodiment of the wiring in the flexible part.
Figure 16:
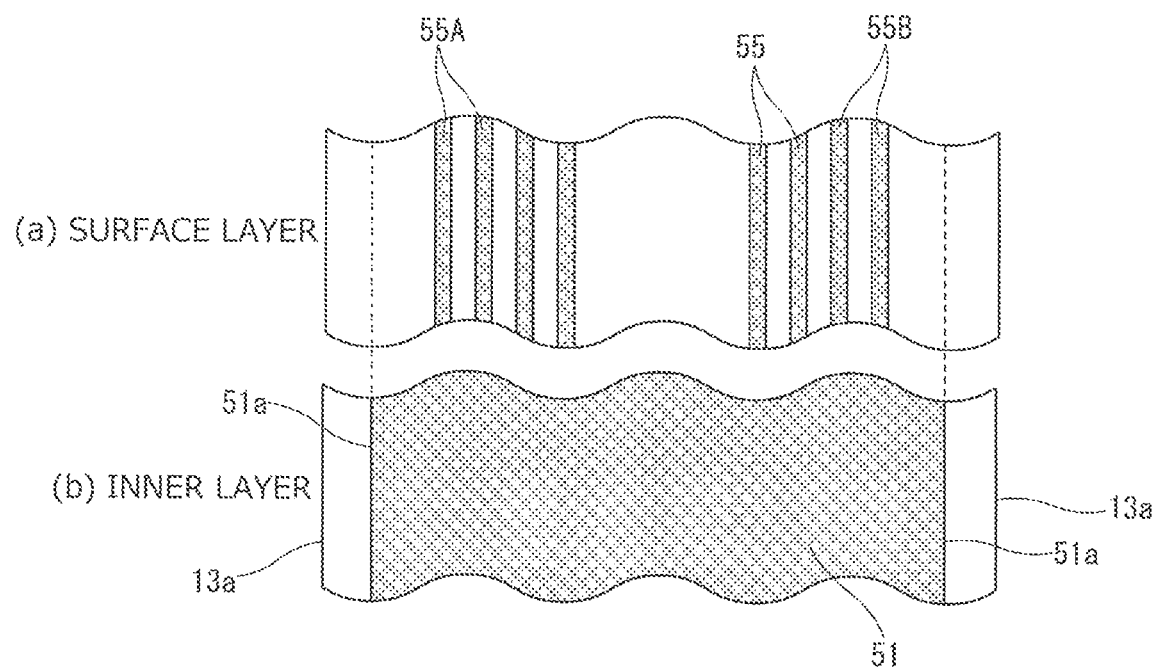
FIG. 16 is an illustrative view schematically showing the configuration of the wiring in the fourth embodiment.

FIG. 15 and FIG. 16 each show a fourth embodiment. FIG. 15 is a plane view of the flexible part 13 viewed from the second surface 3B side that becomes an outer side surface at the time when the flexible part 13 is bent. FIG. 16 is an illustrative view schematically individually showing the wiring on a surface layer and the wiring on an inner layer of the flexible part 13.

In the fourth embodiment, a plurality of inter-rigid-part wirings 55 are formed on the surface layer on the second surface 3B side, and a ground wiring 51 which is shaped like a wide strip is formed on the inner layer. The ground wiring 51 has a width which occupies the almost entire width (dimension in the W direction) of the flexible part 13, and outer edges 51a of the ground wiring 51 along side edges 13a of the flexible part 13 are positioned close to the side edges 13a of the flexible part 13. In addition, a plurality of the inter-rigid-part wirings 55 on the surface layer are positioned more on the inner side in the W direction than a pair of the outer edges 51a of the ground wiring 51.

Here, in the fourth embodiment, of a plurality of the inter-rigid-part wirings 55, two sensor signal wirings 55A for supplying the detection signal of the first rotation sensor 37 from the first rigid part 11 to the second rigid part 12 are arranged close to one of the side edges 13a, and two sensor signal wirings 55B for supplying the detection single of the second rotation sensor 38 from the first rigid part 11 to the second rigid part 12 are arranged close to the other of the side edges 13a. That is, of a plurality of the inter-rigid-part wirings 55, the sensor signal wirings 55A, 55B are positioned on the outermost side in the width direction of the flexible part 13. The drive signal wirings are positioned on the inner side of the sensor signal wirings 55A, 55B. In addition, as mentioned above, the detection signal of the first rotation sensor 37 is branched into two systems in the first rigid part 11, and supplied to the second rigid part 12 via the sensor signal wirings 55A. Similarly, the detection signal of the second rotation sensor 38 is branched into two systems in the first rigid part 11, and supplied to the second rigid part 12 via the sensor signal wirings 55B.

In such a configuration, even if cracks occur to one of the side edges 13a of the flexible part 13, the cracks reach to the area of the inter-rigid-part wirings 55, and then the disconnection of any of the sensor signal wirings 55A, 55B positioned on the outermost side occurs, one of the detection signals of the first rotation sensor 37 and the second rotation sensor 38 is effectively supplied to the second rigid part 12, without any trouble, the driving and controlling of the motor 1A can be carried out. It is similar in case where the two sensor signal wirings 55A or the two sensor signal wirings 55B are disconnected, and thereby the occurrence of serious conditions can be avoided.

Figure 17:
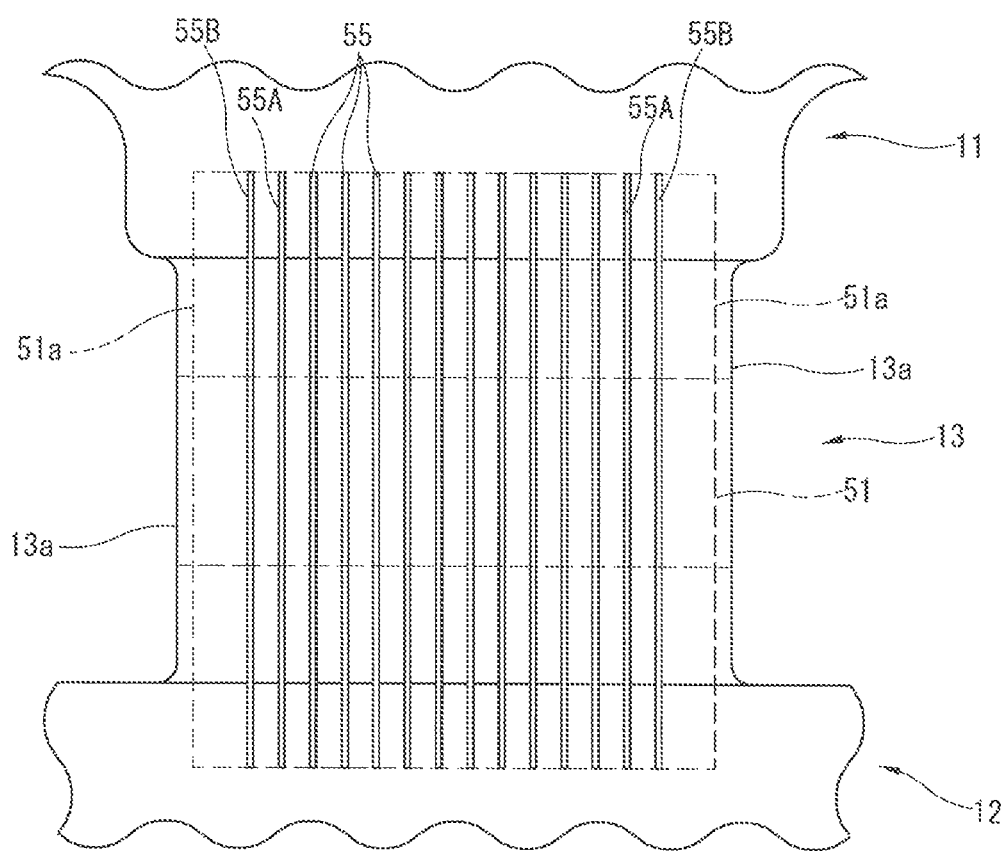
FIG. 17 is a plane view of a main part showing a fifth embodiment of the wiring in the flexible part.
Figure 18:
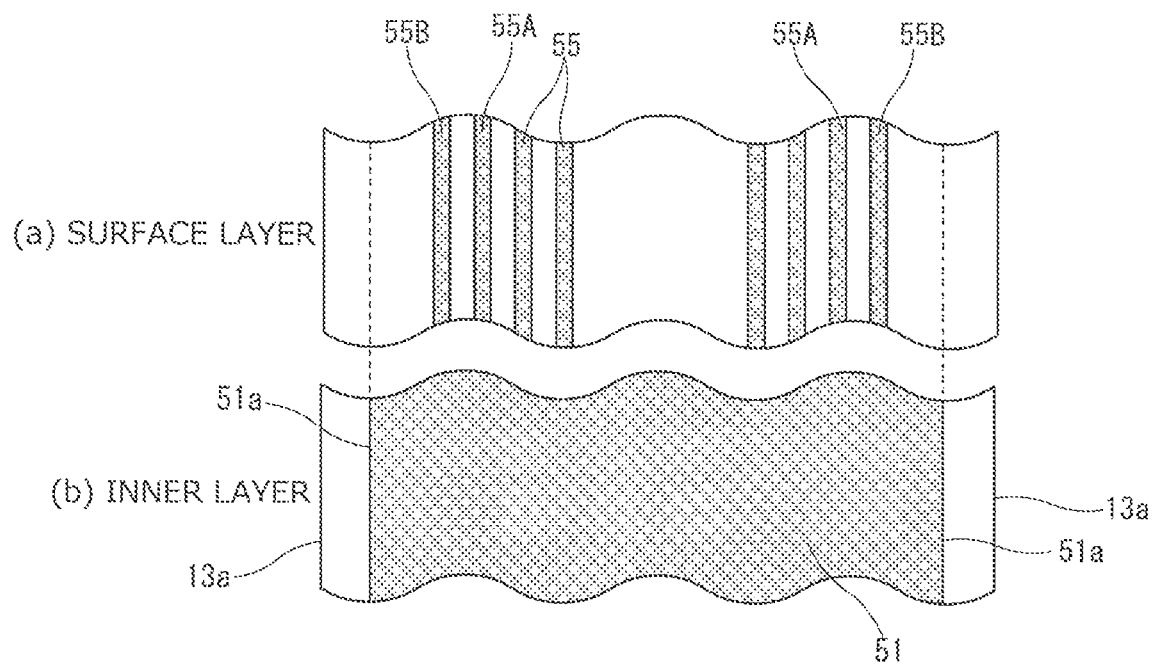
FIG. 18 is an illustrative view schematically showing the configuration of the wiring in the fifth embodiment.

FIG. 17 and FIG. 18 each show a fifth embodiment. FIG. 17 is a plane view of the flexible part 13 viewed from the second surface 3B side that becomes an outer side surface at the time when the flexible part 13 is bent. FIG. 18 is an illustrative view schematically individually showing the wiring on a surface layer and the wiring on an inner layer of the flexible part 13.

In the fifth embodiment, a plurality of inter-rigid-part wirings 55 are formed on the surface layer on the second surface 3B side, and a ground wiring 51 which is shaped like a wide strip is formed on the inner layer. The ground wiring 51 has a width which occupies the almost entire width (dimension in the W direction) of the flexible part 13, and outer edges 51a of the ground wiring 51 along side edges 13a of the flexible part 13 are positioned close to the side edges 13a of the flexible part 13. In addition, a plurality of the inter-rigid-part wirings 55 on the surface layer are positioned more on the inner side in the W direction than a pair of the outer edges 51a of the ground wiring 51.

Here, in the fourth embodiment, of a plurality of the inter-rigid-part wirings 55, two sensor signal wirings 55B for supplying the detection signal of the second rotation sensor 38 from the first rigid part 11 to the second rigid part 12 are positioned on the outermost side in the width direction of the flexible part 13, and two sensor signal wirings 55A for supplying the detection single of the first rotation sensor 37 from the first rigid part 11 to the second rigid part 12 are arranged on the inner side of the sensor signal wirings 55B so as to be adjacent to the sensor signal wirings 55B. That is, a sensor signal wiring 55A for the first rotation sensor 37 and a sensor signal wiring 55B for the second rotation sensor 38 used in one of the control systems are positioned on the side of one of the side edges 13a of the flexible part 13, and a sensor signal wiring 55A for the first rotation sensor 37 and a sensor signal wiring 55B for the second rotation sensor 38 used in the other of the control systems are positioned on the side of the other of the side edges 13a of the flexible part 13.

In addition, in the present embodiment, since the first rotation sensor 37 is a main rotation sensor, and the second rotation sensor 38 is an auxiliary rotation sensor, the sensor signal wirings 55B for the second rotation sensor 38 are arranged on the outer side. However, the first sensor signal wirings 55A for the first rotation sensor 37 may be arranged on the outer side.

In such a configuration, even if cracks occur to one of the side edges 13a of the flexible part 13, the cracks reach to the area of the inter-rigid-part wirings 55, and then one of the sensor signal wirings 55B for the second rotation sensor 38 which are positioned on the outermost side is disconnected, the detection signal of the first rotation sensor 37 is effectively input to the two systems, without any trouble, the driving and controlling of the motor 1A can be carried out. Even if a sensor signal wiring 55A and a sensor signal wiring 55B positioned on the side of one of the side edges 13a are disconnected, the driving and controlling of the motor 1A by the other of the control systems can be carried out.

Figure 19:
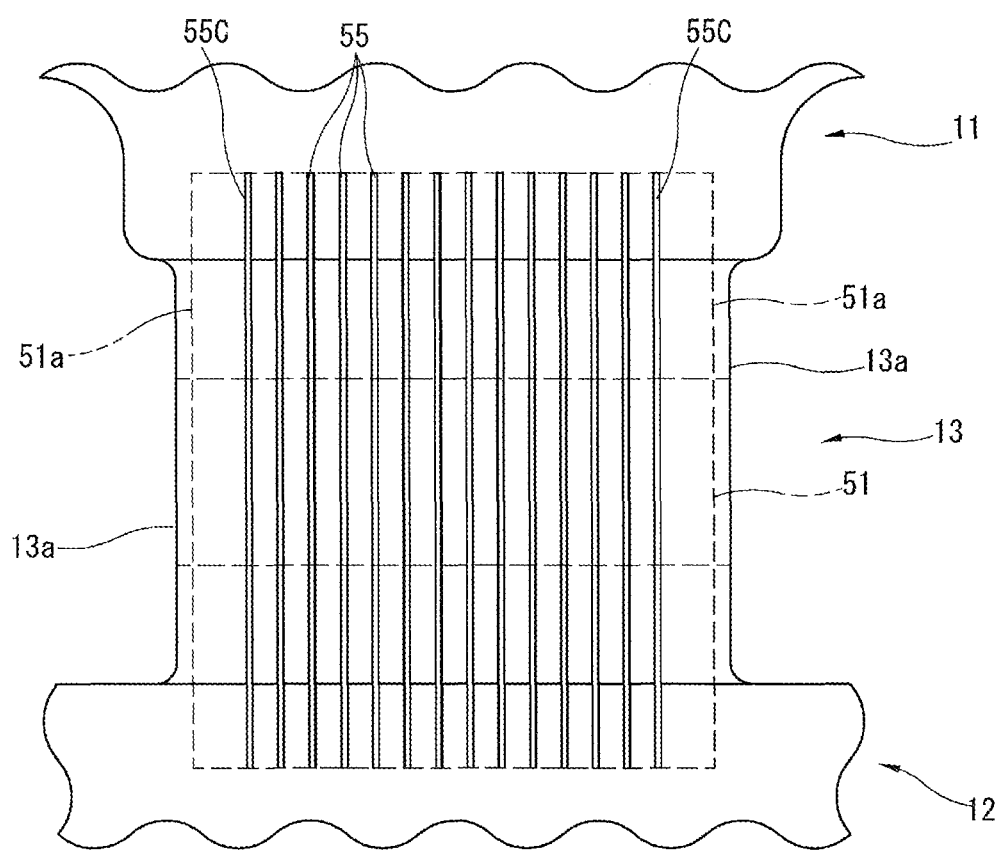
FIG. 19 is a plane view of a main part showing a sixth embodiment of the wiring in the flexible part.
Figure 20:
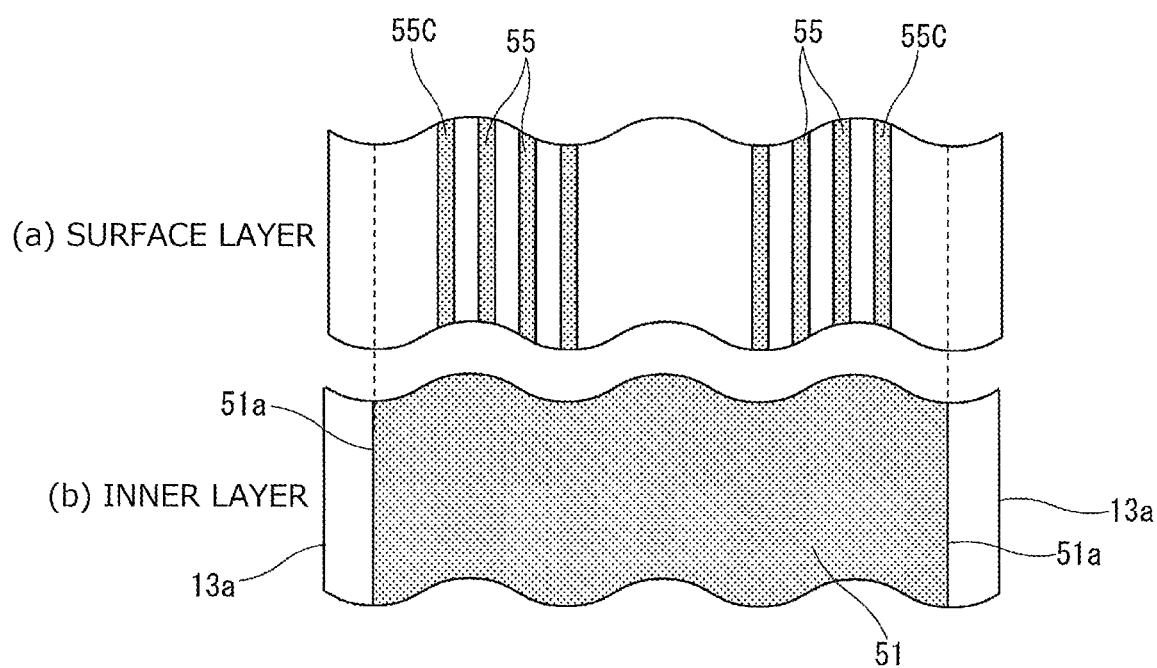
FIG. 20 is an illustrative view schematically showing the configuration of the wiring in the sixth embodiment.

FIG. 19 and FIG. 20 each show a sixth embodiment. FIG. 19 is a plane view of the flexible part 13 viewed from the second surface 3B side that becomes an outer side surface at the time when the flexible part 13 is bent. FIG. 20 is an illustrative view schematically individually showing the wiring on a surface layer and the wiring on an inner layer of the flexible part 13.

In the sixth embodiment, a plurality of inter-rigid-part wirings 55 are formed on the surface layer on the second surface 3B side, and a ground wiring 51 which is shaped like a wide strip is formed on the inner layer. The ground wiring 51 has a width which occupies the almost entire width (dimension in the W direction) of the flexible part 13, and outer edges 51a of the ground wiring 51 along side edges 13a of the flexible part 13 are positioned close to the side edges 13a of the flexible part 13. In addition, a plurality of the inter-rigid-part wirings 55 on the surface layer are positioned more on the inner side in the W direction than a pair of the outer edges 51a of the ground wiring 51.

Here, in the sixth embodiment, of a plurality of the inter-rigid-part wirings 55, a pair of wirings positioned on the outermost side is configured as disconnection detection wirings 55C. For example, appropriate wirings such as sensor signal wirings for the rotation sensors 37, 38 can be used as the disconnection detection wirings 55C, and by including a disconnection detection circuit into a circuit to which the wirings are connected, disconnection can be detected. Therefore, when one of the disconnection detection wirings 55C is disconnected due to cracks, at this time, abnormality can be detected, and thereby, before a serious condition occurs, it is possible to take a measure to, for example, replace a component. In addition, as mentioned above, even if one of the control systems cannot be used due to the disconnection of one of the disconnection detection wirings 55C, the driving and controlling of the motor 1A can be carried out by the other of the control systems.

That is, in case where a pair of the disconnection detection wirings 55C is used as the sensor signal wirings or the drive signal wirings, it is desirable to select, as the disconnection detection wirings 55C, a pair of equivalent signal wirings for exchanging the same signal in a pair of each of the control systems. Consequently, it is possible to detect the disconnection of one of the control systems while securing the driving and controlling of the electric motor 1A by the other of the control systems.

Figure 21:
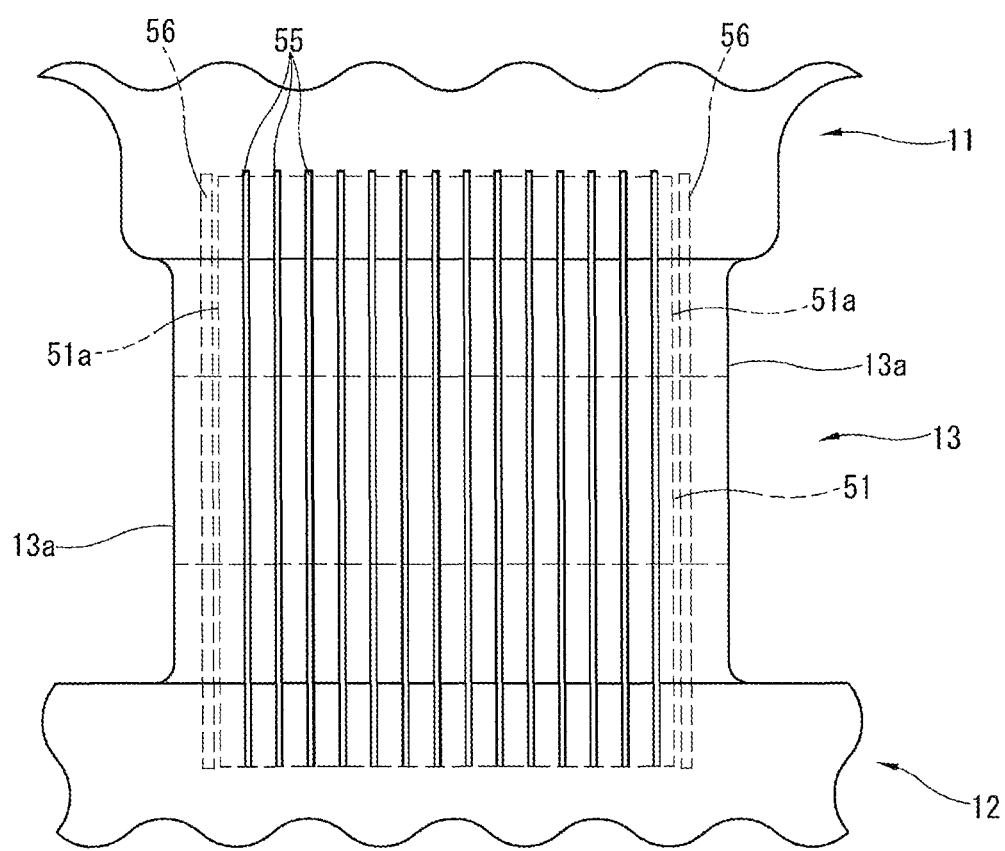
FIG. 21 is a plane view of a main part showing a seventh embodiment of the wiring in the flexible part.
Figure 22:
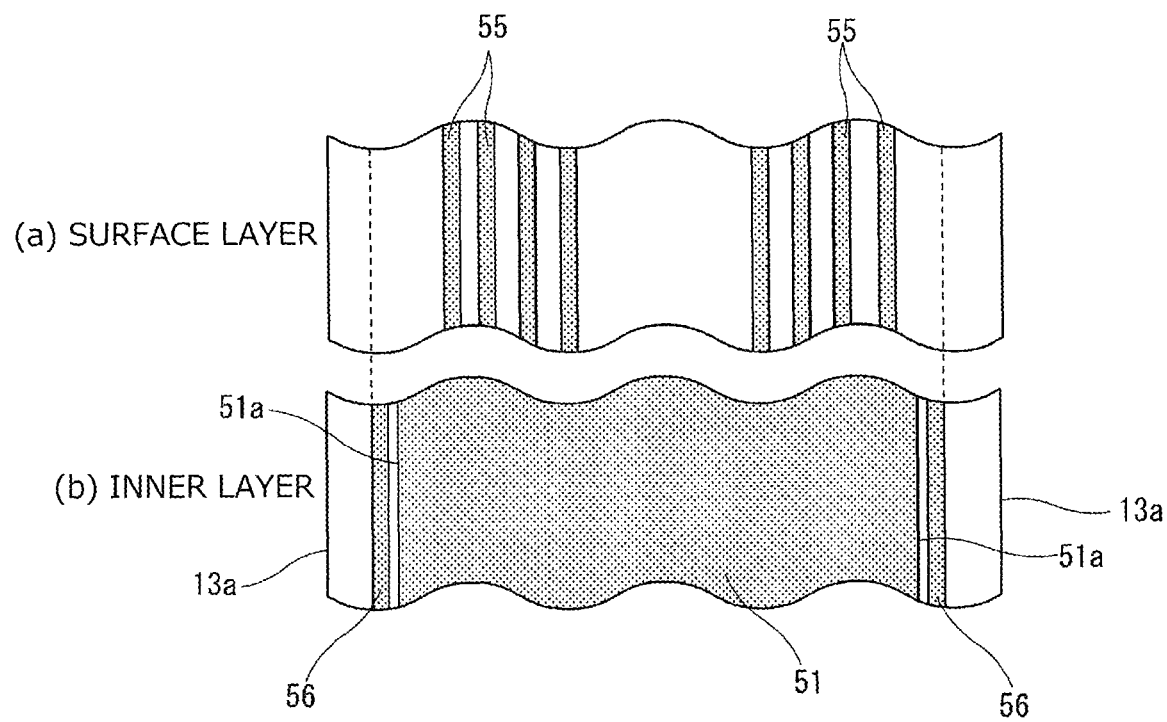
FIG. 22 is an illustrative view schematically showing the configuration of the wiring in the seventh embodiment.

FIG. 21 and FIG. 22 each show a seventh embodiment. FIG. 21 is a plane view of the flexible part 13 viewed from the second surface 3B side that becomes an outer side surface at the time when the flexible part 13 is bent. FIG. 22 is an illustrative view schematically individually showing the wiring on a surface layer and the wiring on an inner layer of the flexible part 13.

In the seventh embodiment, a plurality of inter-rigid-part wirings 55 are formed on the surface layer on the second surface 3B side, and a ground wiring 51 which is shaped like a wide strip is formed on the inner layer. The ground wiring 51 has a width which occupies the almost entire width (dimension in the W direction) of the flexible part 13, and a plurality of the inter-rigid-part wirings 55 on the surface layer are arranged more on the inner side in the W direction than a pair of outer edges 51a of the ground wiring 51.

Here, in the seventh embodiment, disconnection detection wirings 56 are provided more on the outer side than the outer edges 51a of the ground wiring 51 on the inner layer. The disconnection detection wirings 56 are connected to a disconnection detection circuit so as to be able to detect disconnection caused by cracks.

As the disconnection detection wirings 56, a wiring provided for only detecting disconnection without sending and receiving other signals may be used, or, similar to the disconnection detection wirings 55C in the sixth embodiment, a wiring used also as an appropriate sensor signal wiring may be used. Each of the disconnection detection wirings 56 in the seventh embodiment is not protected, by the ground wiring 51, from cracks, and it is therefore preferable to use wirings not seriously affecting the driving and controlling of the motor 1A even if the wirings are disconnected. As the disconnection detection wirings 56, it is desirable to select at least a pair of equivalent signal wirings for exchanging the same signal in a pair of each of the control systems as mentioned above. Consequently, the disconnection in one of the control systems can be detected while securing the driving and controlling of the motor 1A by the other of the control systems.

As the above, although one embodiment of the present invention has been explained, the present invention is not limited to the above embodiments, and various modification can be performed. For example, although the flexible part 13 is shaped like a wide strip having a fixed width in the above embodiments, even in case where the flexible part does not have such a simple shape, the present invention can also be applied. In addition, in the above embodiments, although the flexible part 13 is configured by removing four layers of the six layers of the circuit substrate, the present invention is not limited to such a configuration. Moreover, it is not required that the width in the W direction of the flexible part 13 is smaller than that in the W direction of each of the rigid parts 11, 12.

Furthermore, in the above embodiments, in the side edges 13a on the right and left sides of the flexible part 13, the outer edges 51a of the ground wiring 51 are positioned more on the outer side than the inter-rigid-part wirings 55. However, for example, in case where the flexible part 13 is configured so as not to be symmetrical, in only one of the side edges 13a, a corresponding one of the outer edges 51a of the ground wiring 51 may be positioned more on the outer side than the inter-rigid-part wirings 55.

In addition, the present invention is not limited to the circuit substrate for the above electric actuator for a power steering apparatus, and can be applied to an electronic circuit device for various use.

Moreover, some electronic components other than the above-mentioned electronic components may be mounted on the middle rigid part 14 existing between the first rigid part 11 and the second rigid part 12, and such a configuration is not excluded in the present invention.

As the above, an electronic device includes a circuit substrate on which electronic components are mounted, wherein the circuit substrate includes: at least two component mounting parts on which the electronic components are mounted; a flexible part positioned between adjacent two of the component mounting parts, and formed to be thinner than a thickness of each of substrates of the component mounting parts so as to have a flexibility higher than that of each of the component mounting parts; a plurality of inter-component-mounting-part wirings that are power source positive electrode wirings and signal wirings extending between the two component mounting parts, in the flexible part; and at least one ground wiring provided on a same layer as or a different layer from that of the inter-component-mounting-part wirings, and having side edges along side edges of the flexible part such that the side edges of the ground wiring are positioned closer to the side edges of the flexible part than to the inter-component-mounting-part wirings, in the flexible part.

In a preferable aspect, a second component mounting part of the component mounting parts is mounted with an electronic component of an operation processing part for calculating an operation amount for an electric actuator, and a first component mounting part of the component mounting parts is mounted with a sensor for detecting an operation condition of the electric actuator, the flexible part is provided with, as the inter-component-mounting-part wirings, drive signal wirings through which a control signal based on the operation amount flows and sensor signal wirings through which a detection signal of the sensor flows, and the sensor signal wirings are positioned closer to the side edges of the flexible part than to the drive signal wirings.

For example, the sensor includes a first sensor and a second sensor, and a detection object of the first sensor is a same as that of the second sensor, and, in the flexible part, a pair of sensor signal wirings for the first sensor is positioned closer to the respective side edges of the flexible part than to a pair of sensor signal wirings for the second sensor.

In another preferable aspect, the inter-component-mounting-part wirings includes a disconnection detection wiring as one of the inter-component-mounting-part wirings, and, of a plurality of the inter-component-mounting-part wirings, the disconnection detection wiring is positioned closest to a corresponding one of the side edges (13a) of the flexible part.

In another aspect, a disconnection detection wiring is provided separately from the inter-component-mounting-part wirings, and the disconnection detection wiring is positioned closer to a corresponding one of the side edges of the flexible part than to a corresponding one of the outer edges of the ground wiring.

Preferably, as the disconnection detection wiring, a pair of the disconnection detection wirings is included, and the disconnection detection wirings are arranged so as to correspond to the respective side edges on both sides of the flexible part, in the circuit substrate, each of two control systems is configured so as to include an electronic component group mounted on the first component mounting part, a CPU mounted on the second component mounting part and one of the disconnection detection wirings, and disconnection of the disconnection detection wirings is detected in each of the control systems.

Alternatively, the disconnection detection wiring includes a pair of the disconnection detection wirings, and the disconnection detection wirings are arranged so as to correspond to the respective side edges on both sides of the flexible part, and a pair of the disconnection detection wirings is sensor signal wirings through which a same detection signal from a sensor mounted on one of the component mounting parts flows.

In another preferable aspect, in each of boundaries between the component mounting parts and the flexible part, a thickness of an insulation substrate material of the circuit substrate gradually decreases such that a thickness of each of the substrates of the component mounting parts continuously changes to a thickness of a substrate of a flexible part.

In further another aspect, the flexible part includes, in a middle part between the two component mounting parts, a middle rigid part having a relatively thick thickness, and, in each of boundaries between the middle rigid part and the adjacent flexible part having a relatively thin thickness, the insulation substrate material gradually decreases such that a thickness of a substrate of the middle rigid part continuously changes to the thickness of the substrate of the flexible part.

The invention claimed is:

1. An electronic device comprising:
a circuit substrate on which electronic components are mounted,
wherein the circuit substrate includes:
at least two component mounting parts on which the electronic components are mounted;
a flexible part positioned between adjacent two of the component mounting parts, and formed to be thinner than a thickness of each of substrates of the component mounting parts so as to have a flexibility higher than that of each of the component mounting parts;
a plurality of inter-component-mounting-part wirings that are power source positive electrode wirings and signal wirings extending between the two component mounting parts, in the flexible part; and
at least one ground wiring provided on a same layer as or a different layer from that of the inter-component-mounting-part wirings, and having side edges along side edges of the flexible part such that the side edges of the ground wiring are positioned closer to the side edges of the flexible part than to the inter-component-mounting-part wirings, in the flexible part,
wherein a second component mounting part of the component mounting parts is mounted with an electronic component of an operation processing part for calculating an operation amount for an electric actuator, and a first component mounting part of the component mounting parts is mounted with a sensor for detecting an operation condition of the electric actuator,
wherein the flexible part is provided with, as the inter-component-mounting-part wirings, drive signal wirings through which a control signal based on the operation amount flows and sensor signal wirings through which a detection signal of the sensor flows, and
wherein the sensor signal wirings are positioned closer to the side edges of the flexible part than to the drive signal wirings,
wherein the sensor includes a first sensor and a second sensor, and a detection object of the first sensor is a same as that of the second sensor, and
wherein, in the flexible part, a pair of sensor signal wirings for the first sensor is positioned closer to the respective side edges of the flexible part than to a pair of sensor signal wirings for the second sensor.

2. The electronic device according to claim 1, wherein the inter-component-mounting-part wirings includes a disconnection detection wiring as one of the inter-component-mounting-part wirings, and
wherein, of a plurality of the inter-component-mounting-part wirings, the disconnection detection wiring is positioned closest to a corresponding one of the side edges of the flexible part.

3. The electronic device according to claim 2, wherein, as the disconnection detection wiring, a pair of the disconnection detection wirings is included, and the disconnection detection wirings are arranged so as to correspond to the respective side edges on both sides of the flexible part,
wherein, in the circuit substrate, each of two control systems is configured so as to include an electronic component group mounted on the first component mounting part, a CPU mounted on the second component mounting part and one of the disconnection detection wirings, and
wherein disconnection of the disconnection detection wirings is detected in each of the control systems.

4. The electronic device according to claim 2, wherein the disconnection detection wiring includes a pair of the disconnection detection wirings, and the disconnection detection wirings are arranged so as to correspond to the respective side edges on both sides of the flexible part, and
wherein a pair of the disconnection detection wirings is sensor signal wirings through which a same detection signal from a sensor mounted on one of the component mounting parts flows.

5. The electronic device according to claim 1, wherein a disconnection detection wiring is provided separately from the inter-component-mounting-part wirings, and wherein the disconnection detection wiring is positioned closer to a corresponding one of the side edges of the flexible part than to a corresponding one of the outer edges of the ground wiring.

6. The electronic device according to claim 1, wherein, as the disconnection detection wiring, a pair of the disconnection detection wirings is included, and the disconnection detection wirings are arranged so as to correspond to the respective side edges on both sides of the flexible part,
  wherein, in the circuit substrate, each of two control systems is configured so as to include an electronic component group mounted on the first component mounting part, a CPU mounted on the second component mounting part and one of the disconnection detection wirings, and
  wherein disconnection of the disconnection detection wirings is detected in each of the control systems.

7. The electronic device according to claim 5, wherein the disconnection detection wiring includes a pair of the disconnection detection wirings, and the disconnection detection wirings are arranged so as to correspond to the respective side edges on both sides of the flexible part, and
  wherein a pair of the disconnection detection wirings is sensor signal wirings through which a same detection signal from a sensor mounted on one of the component mounting parts flows.

8. The electronic device according to claim 1, wherein, in each of boundaries between the component mounting parts and the flexible part, a thickness of an insulation substrate material of the circuit substrate gradually decreases such that a thickness of each of the substrates of the component mounting parts continuously changes to a thickness of a substrate of a flexible part.

9. The electronic device according to claim 8, wherein the flexible part includes, in a middle part between the two component mounting parts, a middle rigid part having a relatively thick thickness, and
  wherein, in each of boundaries between the middle rigid part and the adjacent flexible part having a relatively thin thickness, the insulation substrate material gradually decreases such that a thickness of a substrate of the middle rigid part continuously changes to the thickness of the substrate of the flexible part.

* * * * *